US009952930B2

(12) United States Patent
Abhijeet et al.

(10) Patent No.: US 9,952,930 B2
(45) Date of Patent: Apr. 24, 2018

(54) REALLOCATION IN A DISPERSED STORAGE NETWORK (DSN)

(71) Applicant: International Business Machines Corporation, Armonk, NY (US)

(72) Inventors: Kumar Abhijeet, Chicago, IL (US); Manish Motwani, Chicago, IL (US); Jason K. Resch, Chicago, IL (US); Ethan S. Wozniak, Park Ridge, IL (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/331,484

(22) Filed: Oct. 21, 2016

(65) Prior Publication Data

US 2017/0123910 A1    May 4, 2017

Related U.S. Application Data

(60) Provisional application No. 62/248,752, filed on Oct. 30, 2015.

(51) Int. Cl.
*G06F 11/10* (2006.01)
*G06F 11/00* (2006.01)
(Continued)

(52) U.S. Cl.
CPC .......... *G06F 11/1092* (2013.01); *G06F 3/064* (2013.01); *G06F 3/0604* (2013.01);
(Continued)

(58) Field of Classification Search
None
See application file for complete search history.

(56) References Cited

U.S. PATENT DOCUMENTS 4,092,732 A    5/1978  Ouchi
5,454,101 A    9/1995  Mackay et al.
(Continued)

OTHER PUBLICATIONS

Shamir; How to Share a Secret; Communications of the ACM; vol. 22, No. 11; Nov. 1979; pp. 612-613.
(Continued)

*Primary Examiner* — Justin R Knapp
(74) *Attorney, Agent, or Firm* — Garlick & Markison; Timothy W. Markison; Shayne X. Short

(57) ABSTRACT

A computing device includes an interface configured to interface and communicate with a dispersed storage network (DSN), a memory that stores operational instructions, and a processing module operably coupled to the interface and memory such that the processing module, when operable within the computing device based on the operational instructions, is configured to perform various operations. When a is to DSN undergo a change from a first system configuration of a Decentralized, or Distributed, Agreement Protocol (DAP) to a second system configuration of the DAP (e.g., such as based on addition, and/or removal of storage unit(s) (SU(s)) within the DSN or reallocation of data within the DSN, etc.), a computing device identifies a DAP transition mapping between the first system configuration of the DAP to the second system configuration of the DAP. Then, the computing device directs SU(s) to operate based on the DAP transition mapping during the transition.

20 Claims, 14 Drawing Sheets

(51) Int. Cl.

| | | |
|---|---|---|
| *G06F 3/06* | (2006.01) | |
| *H03M 13/05* | (2006.01) | |
| *H03M 13/15* | (2006.01) | |
| *H04L 12/26* | (2006.01) | |
| *H04L 29/08* | (2006.01) | |
| *G06F 11/20* | (2006.01) | |
| *H03M 13/37* | (2006.01) | |

(52) U.S. Cl.
CPC ............ *G06F 3/067* (2013.01); *G06F 3/0611* (2013.01); *G06F 3/0619* (2013.01); *G06F 3/0659* (2013.01); *G06F 3/0665* (2013.01); *G06F 3/0689* (2013.01); *G06F 11/2094* (2013.01); *H03M 13/1515* (2013.01); *H03M 13/3761* (2013.01); *H04L 43/0864* (2013.01); *H04L 43/16* (2013.01); *H04L 67/1008* (2013.01); *H04L 67/1097* (2013.01); *G06F 2201/805* (2013.01)

(56) References Cited

U.S. PATENT DOCUMENTS

| | | | |
|---|---|---|---|
| 5,485,474 | A | 1/1996 | Rabin |
| 5,774,643 | A | 6/1998 | Lubbers et al. |
| 5,802,364 | A | 9/1998 | Senator et al. |
| 5,809,285 | A | 9/1998 | Hilland |
| 5,890,156 | A | 3/1999 | Rekieta et al. |
| 5,987,622 | A | 11/1999 | Lo Verso et al. |
| 5,991,414 | A | 11/1999 | Garay et al. |
| 6,012,159 | A | 1/2000 | Fischer et al. |
| 6,058,454 | A | 5/2000 | Gerlach et al. |
| 6,128,277 | A | 10/2000 | Bruck et al. |
| 6,175,571 | B1 | 1/2001 | Haddock et al. |
| 6,192,472 | B1 | 2/2001 | Garay et al. |
| 6,256,688 | B1 | 7/2001 | Suetaka et al. |
| 6,272,658 | B1 | 8/2001 | Steele et al. |
| 6,301,604 | B1 | 10/2001 | Nojima |
| 6,356,949 | B1 | 3/2002 | Katsandres et al. |
| 6,366,995 | B1 | 4/2002 | Vilkov et al. |
| 6,374,336 | B1 | 4/2002 | Peters et al. |
| 6,415,373 | B1 | 7/2002 | Peters et al. |
| 6,418,539 | B1 | 7/2002 | Walker |
| 6,449,688 | B1 | 9/2002 | Peters et al. |
| 6,567,948 | B2 | 5/2003 | Steele et al. |
| 6,571,282 | B1 | 5/2003 | Bowman-Amuah |
| 6,609,223 | B1 | 8/2003 | Wolfgang |
| 6,718,361 | B1 | 4/2004 | Basani et al. |
| 6,760,808 | B2 | 7/2004 | Peters et al. |
| 6,785,768 | B2 | 8/2004 | Peters et al. |
| 6,785,783 | B2 | 8/2004 | Buckland |
| 6,826,711 | B2 | 11/2004 | Moulton et al. |
| 6,879,596 | B1 | 4/2005 | Dooply |
| 7,003,688 | B1 | 2/2006 | Pittelkow et al. |
| 7,024,451 | B2 | 4/2006 | Jorgenson |
| 7,024,609 | B2 | 4/2006 | Wolfgang et al. |
| 7,080,101 | B1 | 7/2006 | Watson et al. |
| 7,103,824 | B2 | 9/2006 | Halford |
| 7,103,915 | B2 | 9/2006 | Redlich et al. |
| 7,111,115 | B2 | 9/2006 | Peters et al. |
| 7,140,044 | B2 | 11/2006 | Redlich et al. |
| 7,146,644 | B2 | 12/2006 | Redlich et al. |
| 7,171,493 | B2 | 1/2007 | Shu et al. |
| 7,222,133 | B1 | 5/2007 | Raipurkar et al. |
| 7,240,236 | B2 | 7/2007 | Cutts et al. |
| 7,272,613 | B2 | 9/2007 | Sim et al. |
| 7,636,724 | B2 | 12/2009 | de la Torre et al. |
| 7,769,874 | B2 * | 8/2010 | Sherman ............ G06F 17/30067 707/E17.107 |
| 2002/0062422 | A1 | 5/2002 | Butterworth et al. |
| 2002/0166079 | A1 | 11/2002 | Ulrich et al. |
| 2003/0018927 | A1 | 1/2003 | Gadir et al. |
| 2003/0037261 | A1 | 2/2003 | Meffert et al. |
| 2003/0065617 | A1 | 4/2003 | Watkins et al. |
| 2003/0084020 | A1 | 5/2003 | Shu |
| 2004/0024963 | A1 | 2/2004 | Talagala et al. |
| 2004/0122917 | A1 | 6/2004 | Menon et al. |
| 2004/0215998 | A1 | 10/2004 | Buxton et al. |
| 2004/0228493 | A1 | 11/2004 | Ma |
| 2005/0100022 | A1 | 5/2005 | Ramprashad |
| 2005/0114594 | A1 | 5/2005 | Corbell et al. |
| 2005/0125593 | A1 | 6/2005 | Karpoff et al. |
| 2005/0131993 | A1 | 6/2005 | Fatula |
| 2005/0132070 | A1 | 6/2005 | Redlich et al. |
| 2005/0144382 | A1 | 6/2005 | Schmisseur |
| 2005/0229069 | A1 | 10/2005 | Hassner et al. |
| 2006/0047907 | A1 | 3/2006 | Shiga et al. |
| 2006/0136448 | A1 | 6/2006 | Cialini et al. |
| 2006/0156059 | A1 | 7/2006 | Kitamura |
| 2006/0224603 | A1 | 10/2006 | Correll |
| 2007/0079081 | A1 | 4/2007 | Gladwin et al. |
| 2007/0079082 | A1 | 4/2007 | Gladwin et al. |
| 2007/0079083 | A1 | 4/2007 | Gladwin et al. |
| 2007/0088970 | A1 | 4/2007 | Buxton et al. |
| 2007/0174192 | A1 | 7/2007 | Gladwin et al. |
| 2007/0214285 | A1 | 9/2007 | Au et al. |
| 2007/0234110 | A1 | 10/2007 | Soran et al. |
| 2007/0283167 | A1 | 12/2007 | Venters et al. |
| 2009/0094251 | A1 | 4/2009 | Gladwin et al. |
| 2009/0094318 | A1 | 4/2009 | Gladwin et al. |
| 2010/0023524 | A1 | 1/2010 | Gladwin et al. |

OTHER PUBLICATIONS

Rabin; Efficient Dispersal of Information for Security, Load Balancing, and Fault Tolerance; Journal of the Association for Computer Machinery; vol. 36, No. 2; Apr. 1989; pp. 335-348.

Chung; An Automatic Data Segmentation Method for 3D Measured Data Points; National Taiwan University; pp. 1-8; 1998.

Plank, T1: Erasure Codes for Storage Applications; FAST2005, 4th Usenix Conference on File Storage Technologies; Dec. 13-16, 2005; pp. 1-74.

Wildi; Java iSCSi Initiator; Master Thesis; Department of Computer and Information Science, University of Konstanz; Feb. 2007; 60 pgs.

Legg; Lightweight Directory Access Protocol (LDAP): Syntaxes and Matching Rules; IETF Network Working Group; RFC 4517; Jun. 2006; pp. 1-50.

Zeilenga; Lightweight Directory Access Protocol (LDAP): Internationalized String Preparation; IETF Network Working Group; RFC 4518; Jun. 2006; pp. 1-14.

Smith; Lightweight Directory Access Protocol (LDAP): Uniform Resource Locator; IETF Network Working Group; RFC 4516; Jun. 2006; pp. 1-15.

Smith; Lightweight Directory Access Protocol (LDAP): String Representation of Search Filters; IETF Network Working Group; RFC 4515; Jun. 2006; pp. 1-12.

Zeilenga; Lightweight Directory Access Protocol (LDAP): Directory Information Models; IETF Network Working Group; RFC 4512; Jun. 2006; pp. 1-49.

Sciberras; Lightweight Directory Access Protocol (LDAP): Schema for User Applications; IETF Network Working Group; RFC 4519; Jun. 2006; pp. 1-33.

Harrison; Lightweight Directory Access Protocol (LDAP): Authentication Methods and Security Mechanisms; IETF Network Working Group; RFC 4513; Jun. 2006; pp. 1-32.

Zeilenga; Lightweight Directory Access Protocol (LDAP): Technical Specification Road Map; IETF Network Working 3 Group; RFC 4510; Jun. 2006; pp. 1-8

Zeilenga; Lightweight Directory Access Protocol (LDAP): String Representation of Distinguished Names; IETF Network Working Group; RFC 4514; Jun. 2006; pp. 1-15.

Sermersheim; Lightweight Directory Access Protocol (LDAP): The Protocol; IETF Network Working Group; RFC 1511; Jun. 2006; pp. 1-68.

Satran, et al.; Internet Small Computer Systems Interface (iSCSI); IETF Network Working Group; RFC 3720; Apr. 2004; pp. 1-257.

Xin, et al.; Evaluation of Distributed Recovery in Large-Scale Storage Systems; 13th IEEE International Symposium on High Performance Distributed Computing; Jun. 2004; pp. 172-181.

(56) References Cited

OTHER PUBLICATIONS

Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

\* cited by examiner

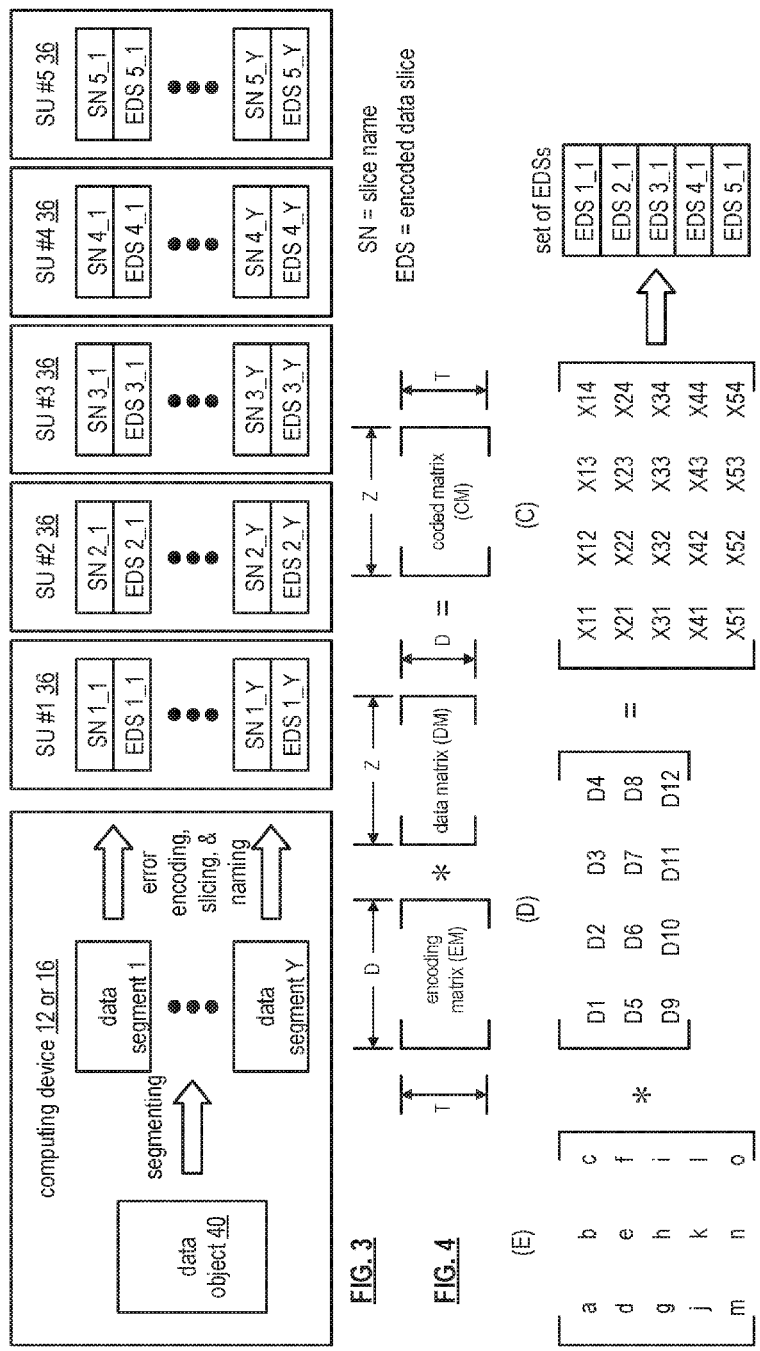

REALLOCATION IN A DISPERSED STORAGE NETWORK (DSN)

CROSS REFERENCE TO RELATED PATENTS

The present U.S. Utility patent application claims priority pursuant to 35 U.S.C. § 119(e) to U.S. Provisional Application No. 62/248,752, entitled "MIGRATING DATA IN A DISPERSED STORAGE NETWORK," filed Oct. 30, 2015, which is hereby incorporated herein by reference in its entirety and made part of the present U.S. Utility patent application for all purposes.

STATEMENT REGARDING FEDERALLY SPONSORED RESEARCH OR DEVELOPMENT

Not applicable.

INCORPORATION-BY-REFERENCE OF MATERIAL SUBMITTED ON A COMPACT DISC

Not applicable.

BACKGROUND OF THE INVENTION

Technical Field of the Invention

This invention relates generally to computer networks and more particularly to dispersing error encoded data.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on an Internet storage system. The Internet storage system may include a RAID (redundant array of independent disks) system and/or a dispersed storage system that uses an error correction scheme to encode data for storage.

In some data storage systems, changes to configuration of such data storage systems may be performed from time to time for various reasons. When such changes are to be made, the prior art does not provide an adequate means by which operation of the system will not be degraded, interrupted, and/or otherwise deleteriously affected when such changes are made to configuration of such data storage systems.

BRIEF DESCRIPTION OF THE SEVERAL VIEWS OF THE DRAWING(S)

FIG. 3 is a schematic block diagram of an example of dispersed storage error encoding of data in accordance with the present invention;

FIG. 4 is a schematic block diagram of a generic example of an error encoding function in accordance with the present invention;

FIG. 5 is a schematic block diagram of a specific example of an error encoding function in accordance with the present invention;

FIG. 6 is a schematic block diagram of an example of a slice name of an encoded data slice (EDS) in accordance with the present invention;

DETAILED DESCRIPTION OF THE INVENTION

Figure 1:
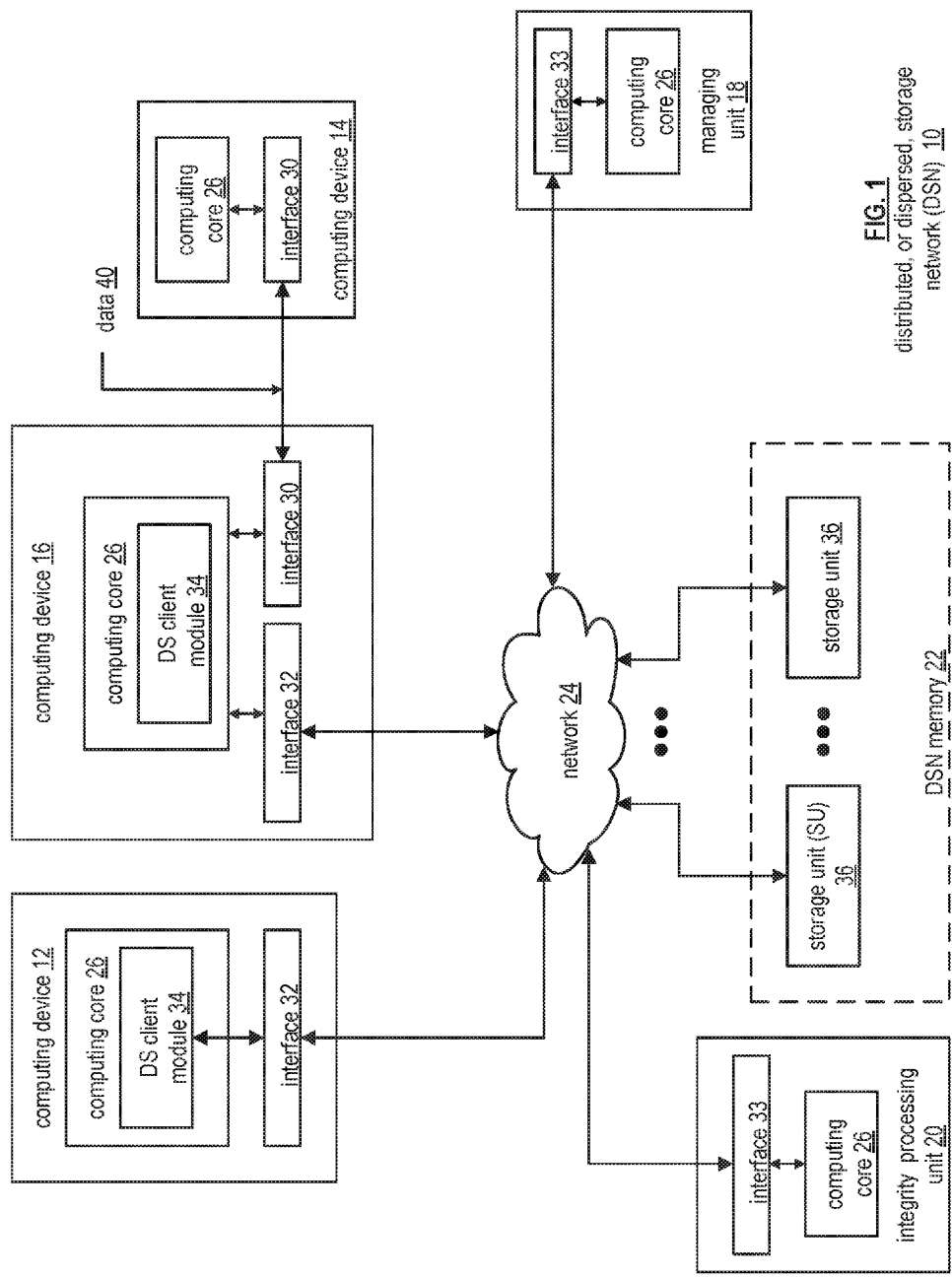
FIG. 1 is a schematic block diagram of an embodiment of a dispersed or distributed storage network (DSN) in accordance with the present invention.

FIG. 1 is a schematic block diagram of an embodiment of a dispersed, or distributed, storage network (DSN) 10 that includes a plurality of computing devices 12-16, a managing unit 18, an integrity processing unit 20, and a DSN memory 22. The components of the DSN 10 are coupled to a network 24, which may include one or more wireless and/or wire lined communication systems; one or more non-public intranet systems and/or public internet systems; and/or one or more local area networks (LAN) and/or wide area networks (WAN).

Figure 2:
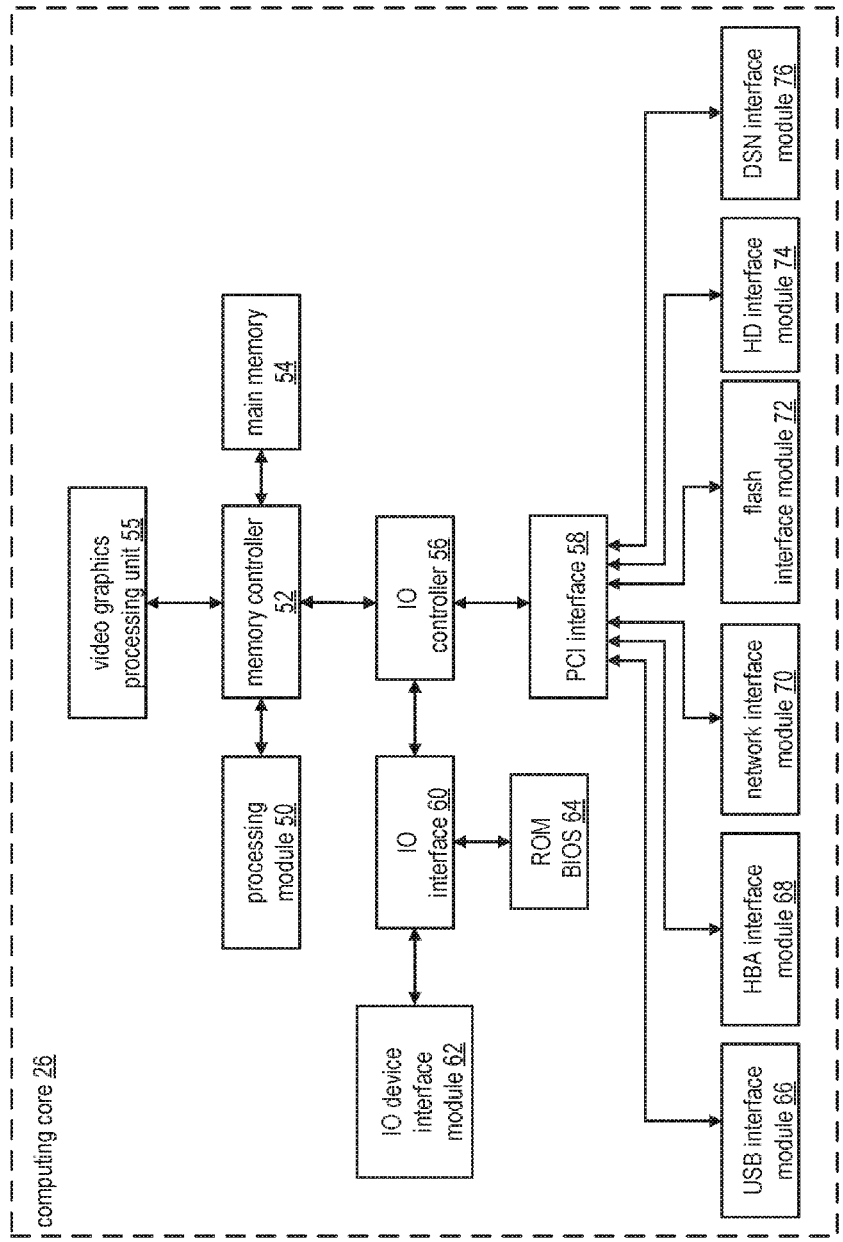
FIG. 2 is a schematic block diagram of an embodiment of a computing core in accordance with the present invention.

The DSN memory 22 includes a plurality of storage units 36 that may be located at geographically different sites (e.g., one in Chicago, one in Milwaukee, etc.), at a common site, or a combination thereof. For example, if the DSN memory 22 includes eight storage units 36, each storage unit is located at a different site. As another example, if the DSN memory 22 includes eight storage units 36, all eight storage units are located at the same site. As yet another example, if the DSN memory 22 includes eight storage units 36, a first pair of storage units are at a first common site, a second pair of storage units are at a second common site, a third pair of storage units are at a third common site, and a fourth pair of storage units are at a fourth common site. Note that a DSN memory 22 may include more or less than eight storage units 36. Further note that each storage unit 36 includes a computing core (as shown in FIG. 2, or components thereof) and a plurality of memory devices for storing dispersed error encoded data.

Each of the computing devices 12-16, the managing unit 18, and the integrity processing unit 20 include a computing core 26, which includes network interfaces 30-33. Computing devices 12-16 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. Note that each of the managing unit 18 and the integrity processing unit 20 may be separate computing devices, may be a common computing device, and/or may be integrated into one or more of the computing devices 12-16 and/or into one or more of the storage units 36.

Each interface 30, 32, and 33 includes software and hardware to support one or more communication links via the network 24 indirectly and/or directly. For example, interface 30 supports a communication link (e.g., wired, wireless, direct, via a LAN, via the network 24, etc.) between computing devices 14 and 16. As another example, interface 32 supports communication links (e.g., a wired connection, a wireless connection, a LAN connection, and/or any other type of connection to/from the network 24) between computing devices 12 & 16 and the DSN memory 22. As yet another example, interface 33 supports a communication link for each of the managing unit 18 and the integrity processing unit 20 to the network 24.

Computing devices 12 and 16 include a dispersed storage (DS) client module 34, which enables the computing device to dispersed storage error encode and decode data as subsequently described with reference to one or more of FIGS. 3-8. In this example embodiment, computing device 16 functions as a dispersed storage processing agent for computing device 14. In this role, computing device 16 dispersed storage error encodes and decodes data on behalf of computing device 14. With the use of dispersed storage error encoding and decoding, the DSN 10 is tolerant of a significant number of storage unit failures (the number of failures is based on parameters of the dispersed storage error encoding function) without loss of data and without the need for a redundant or backup copies of the data. Further, the DSN 10 stores data for an indefinite period of time without data loss and in a secure manner (e.g., the system is very resistant to unauthorized attempts at accessing the data).

In operation, the managing unit 18 performs DS management services. For example, the managing unit 18 establishes distributed data storage parameters (e.g., vault creation, distributed storage parameters, security parameters, billing information, user profile information, etc.) for computing devices 12-14 individually or as part of a group of user devices. As a specific example, the managing unit 18 coordinates creation of a vault (e.g., a virtual memory block associated with a portion of an overall namespace of the DSN) within the DSN memory 22 for a user device, a group of devices, or for public access and establishes per vault dispersed storage (DS) error encoding parameters for a vault. The managing unit 18 facilitates storage of DS error encoding parameters for each vault by updating registry information of the DSN 10, where the registry information may be stored in the DSN memory 22, a computing device 12-16, the managing unit 18, and/or the integrity processing unit 20.

The DSN managing unit 18 creates and stores user profile information (e.g., an access control list (ACL)) in local memory and/or within memory of the DSN module 22. The user profile information includes authentication information, permissions, and/or the security parameters. The security parameters may include encryption/decryption scheme, one or more encryption keys, key generation scheme, and/or data encoding/decoding scheme.

The DSN managing unit 18 creates billing information for a particular user, a user group, a vault access, public vault access, etc. For instance, the DSN managing unit 18 tracks the number of times a user accesses a non-public vault and/or public vaults, which can be used to generate a per-access billing information. In another instance, the DSN managing unit 18 tracks the amount of data stored and/or retrieved by a user device and/or a user group, which can be used to generate a per-data-amount billing information.

As another example, the managing unit 18 performs network operations, network administration, and/or network maintenance. Network operations includes authenticating user data allocation requests (e.g., read and/or write requests), managing creation of vaults, establishing authentication credentials for user devices, adding/deleting components (e.g., user devices, storage units, and/or computing devices with a DS client module 34) to/from the DSN 10, and/or establishing authentication credentials for the storage units 36. Network administration includes monitoring devices and/or units for failures, maintaining vault information, determining device and/or unit activation status, determining device and/or unit loading, and/or determining any other system level operation that affects the performance level of the DSN 10. Network maintenance includes facilitating replacing, upgrading, repairing, and/or expanding a device and/or unit of the DSN 10.

The integrity processing unit 20 performs rebuilding of 'bad' or missing encoded data slices. At a high level, the integrity processing unit 20 performs rebuilding by periodically attempting to retrieve/list encoded data slices, and/or slice names of the encoded data slices, from the DSN memory 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in the DSN memory 22.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSN interface module 76.

The DSN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSN interface module 76 and/or the network interface module 70 may function as one or more of the interface 30-33 of FIG. 1. Note that the IO device interface module 62 and/or the memory interface modules 66-76 may be collectively or individually referred to as IO ports.

FIG. 3 is a schematic block diagram of an example of dispersed storage error encoding of data. When a computing device 12 or 16 has data to store it disperse storage error encodes the data in accordance with a dispersed storage error encoding process based on dispersed storage error encoding parameters. The dispersed storage error encoding parameters include an encoding function (e.g., information dispersal algorithm, Reed-Solomon, Cauchy Reed-Solomon, systematic encoding, non-systematic encoding, on-line codes, etc.), a data segmenting protocol (e.g., data segment size, fixed, variable, etc.), and per data segment encoding values. The per data segment encoding values include a total, or pillar width, number (T) of encoded data slices per encoding of a data segment i.e., in a set of encoded data slices); a decode threshold number (D) of encoded data slices of a set of encoded data slices that are needed to recover the data segment; a read threshold number (R) of encoded data slices to indicate a number of encoded data slices per set to be read from storage for decoding of the data segment; and/or a write threshold number (W) to indicate a number of encoded data slices per set that must be accurately stored before the encoded data segment is deemed to have been properly stored. The dispersed storage error encoding parameters may further include slicing information (e.g., the number of encoded data slices that will be created for each data segment) and/or slice security information (e.g., per encoded data slice encryption, compression, integrity checksum, etc.).

In the present example, Cauchy Reed-Solomon has been selected as the encoding function (a generic example is shown in FIG. 4 and a specific example is shown in FIG. 5); the data segmenting protocol is to divide the data object into fixed sized data segments; and the per data segment encoding values include: a pillar width of 5, a decode threshold of 3, a read threshold of 4, and a write threshold of 4. In accordance with the data segmenting protocol, the computing device 12 or 16 divides the data (e.g., a file (e.g., text, video, audio, etc.), a data object, or other data arrangement) into a plurality of fixed sized data segments (e.g., 1 through Y of a fixed size in range of Kilo-bytes to Tera-bytes or more). The number of data segments created is dependent of the size of the data and the data segmenting protocol.

The computing device 12 or 16 then disperse storage error encodes a data segment using the selected encoding function (e.g., Cauchy Reed-Solomon) to produce a set of encoded data slices. FIG. 4 illustrates a generic Cauchy Reed-Solomon encoding function, which includes an encoding matrix (EM), a data matrix (DM), and a coded matrix (CM). The size of the encoding matrix (EM) is dependent on the pillar width number (T) and the decode threshold number (D) of selected per data segment encoding values. To produce the data matrix (DM), the data segment is divided into a plurality of data blocks and the data blocks are arranged into D number of rows with Z data blocks per row. Note that Z is a function of the number of data blocks created from the data segment and the decode threshold number (D). The coded matrix is produced by matrix multiplying the data matrix by the encoding matrix.

FIG. 5 illustrates a specific example of Cauchy Reed-Solomon encoding with a pillar number (T) of five and decode threshold number of three. In this example, a first data segment is divided into twelve data blocks (D1-D12). The coded matrix includes five rows of coded data blocks, where the first row of X11-X14 corresponds to a first encoded data slice (EDS 1_1), the second row of X21-X24 corresponds to a second encoded data slice (EDS 2_1), the third row of X31-X34 corresponds to a third encoded data slice (EDS 3_1), the fourth row of X41-X44 corresponds to a fourth encoded data slice (EDS 4_1), and the fifth row of X51-X54 corresponds to a fifth encoded data slice (EDS 5_1). Note that the second number of the EDS designation corresponds to the data segment number.

Returning to the discussion of FIG. 3, the computing device also creates a slice name (SN) for each encoded data slice (EDS) in the set of encoded data slices. A typical format for a slice name 60 is shown in FIG. 6. As shown, the slice name (SN) 60 includes a pillar number of the encoded data slice (e.g., one of 1-T), a data segment number (e.g., one of 1-Y), a vault identifier (ID), a data object identifier (ID), and may further include revision level information of the encoded data slices. The slice name functions as, at least part of, a DSN address for the encoded data slice for storage and retrieval from the DSN memory 22.

As a result of encoding, the computing device 12 or 16 produces a plurality of sets of encoded data slices, which are provided with their respective slice names to the storage units for storage. As shown, the first set of encoded data slices includes EDS 1_1 through EDS 5_1 and the first set of slice names includes SN 1_1 through SN 5_1 and the last set of encoded data slices includes EDS 1_Y through EDS 5_Y and the last set of slice names includes SN 1_Y through SN 5_Y.

Figure 7:
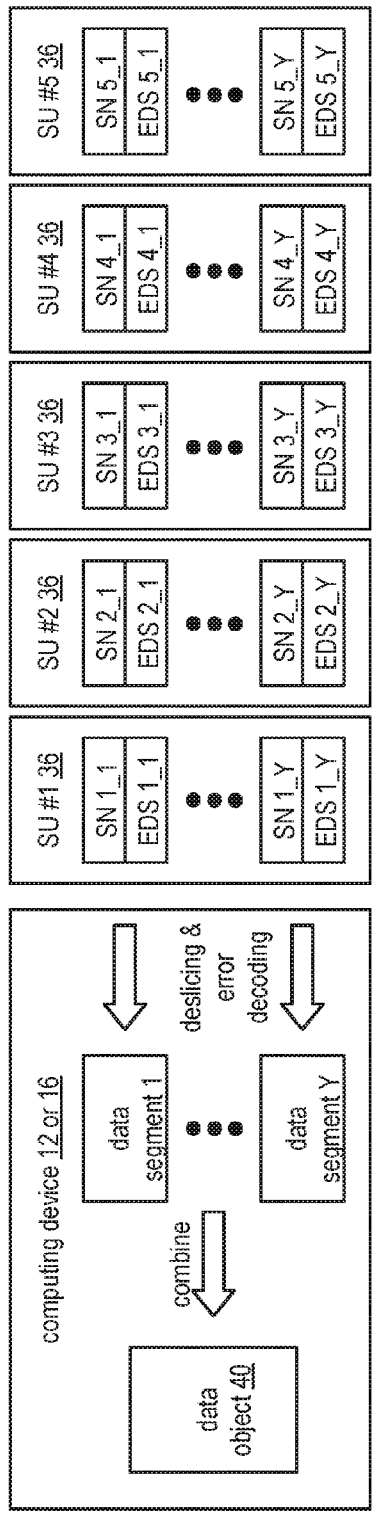
FIG. 7 is a schematic block diagram of an example of dispersed storage error decoding of data in accordance with the present invention.

FIG. 7 is a schematic block diagram of an example of dispersed storage error decoding of a data object that was dispersed storage error encoded and stored in the example of FIG. 4. In this example, the computing device 12 or 16 retrieves from the storage units at least the decode threshold number of encoded data slices per data segment. As a specific example, the computing device retrieves a read threshold number of encoded data slices.

Figure 8:
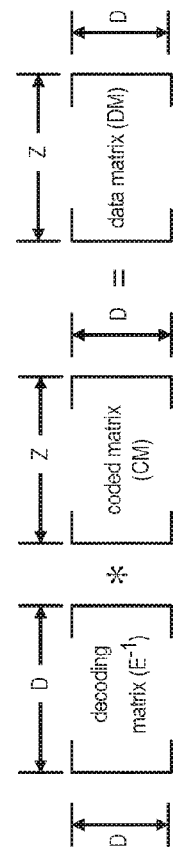
FIG. 8 is a schematic block diagram of a generic example of an error decoding function in accordance with the present invention.

To recover a data segment from a decode threshold number of encoded data slices, the computing device uses a decoding function as shown in FIG. 8. As shown, the decoding function is essentially an inverse of the encoding function of FIG. 4. The coded matrix includes a decode threshold number of rows (e.g., three in this example) and the decoding matrix in an inversion of the encoding matrix that includes the corresponding rows of the coded matrix. For example, if the coded matrix includes rows 1, 2, and 4, the encoding matrix is reduced to rows 1, 2, and 4, and then inverted to produce the decoding matrix.

Figure 9:
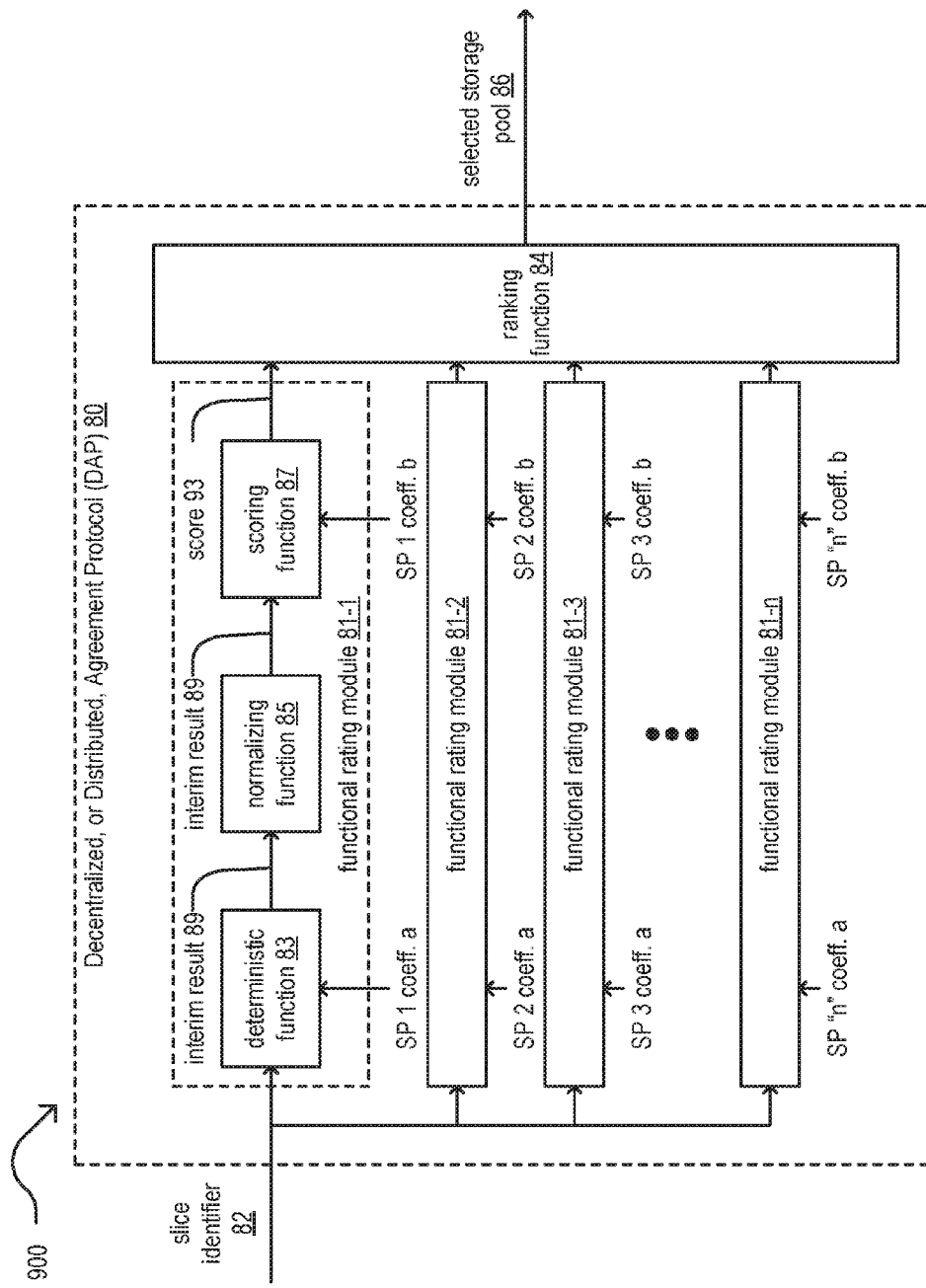
FIG. 9 is a schematic block diagram of an embodiment of a Decentralized, or Distributed, Agreement Protocol (DAP) in accordance with the present invention.

FIG. 9 is a schematic block diagram 900 of an embodiment of a Decentralized, or Distributed, Agreement Protocol (DAP) 80 that may be implemented by a computing device, a storage unit, and/or any other device or unit of the DSN to determine where to store encoded data slices or where to find stored encoded data slices. The DAP 80 includes a plurality of functional rating modules 81. Each of the functional rating modules 81 includes a deterministic function 83, a normalizing function 85, and a scoring function 87.

Each functional rating module 81 receives, as inputs, a slice identifier 82 and storage pool (SP) coefficients (e.g., a first functional rating module 81-1 receives SP 1 coefficients "a" and b). Based on the inputs, where the SP coefficients are different for each functional rating module 81, each functional rating module 81 generates a unique score 93 (e.g., an alpha-numerical value, a numerical value, etc.). The ranking function 84 receives the unique scores 93 and orders them based on an ordering function (e.g., highest to lowest, lowest to highest, alphabetical, etc.) and then selects one as a selected storage pool 86. Note that a storage pool includes one or more sets of storage units 86. Further note that the slice identifier 82 corresponds to a slice name or common attributes of set of slices names. For example, for a set of encoded data slices, the slice identifier 120 specifies a data segment number, a vault ID, and a data object ID, but leaves open ended, the pillar number. As another example, the slice identifier 82 specifies a range of slice names (e.g., 0000 0000 to FFFF FFFF).

As a specific example, the first functional module 81-1 receives the slice identifier 82 and SP coefficients for storage pool 1 of the DSN. The SP coefficients includes a first coefficient (e.g., "a") and a second coefficient (e.g., "b"). For example, the first coefficient is a unique identifier for the corresponding storage pool (e.g., SP #1's ID for SP 1 coefficient "a") and the second coefficient is a weighting factor for the storage pool. The weighting factors are derived to ensure, over time, data is stored in the storage pools in a fair and distributed manner based on the capabilities of the storage units within the storage pools.

For example, the weighting factor includes an arbitrary bias which adjusts a proportion of selections to an associated location such that a probability that a source name will be mapped to that location is equal to the location weight divided by a sum of all location weights for all locations of comparison (e.g., locations correspond to storage units). As a specific example, each storage pool is associated with a location weight factor based on storage capacity such that, storage pools with more storage capacity have a higher location weighting factor than storage pools with less storage capacity.

The deterministic function 83, which may be a hashing function, a hash-based message authentication code function, a mask generating function, a cyclic redundancy code function, hashing module of a number of locations, consistent hashing, rendezvous hashing, and/or a sponge function, performs a deterministic function on a combination and/or concatenation (e.g., add, append, interleave) of the slice identifier 82 and the first SP coefficient (e.g., SU 1 coefficient "a") to produce an interim result 89.

The normalizing function 85 normalizes the interim result 89 to produce a normalized interim result 91. For instance, the normalizing function 85 divides the interim result 89 by a number of possible output permutations of the deterministic function 83 to produce the normalized interim result. For example, if the interim result is 4,325 (decimal) and the number of possible output permutations is 10,000, then the normalized result is 0.4325.

The scoring function 87 performs a mathematical function on the normalized result 91 to produce the score 93. The mathematical function may be division, multiplication, addition, subtraction, a combination thereof, and/or any mathematical operation. For example, the scoring function divides the second SP coefficient (e.g., SP 1 coefficient "b") by the negative log of the normalized result (e.g., $e^y=x$ and/or $\ln(x)=y$). For example, if the second SP coefficient is 17.5 and the negative log of the normalized result is 1.5411 (e.g., $e^{(0.42335)}$), the score is 11.3555.

The ranking function 84 receives the scores 93 from each of the function rating modules 81 and orders them to produce a ranking of the storage pools. For example, if the ordering is highest to lowest and there are five storage units in the DSN, the ranking function evaluates the scores for five storage units to place them in a ranked order. From the ranking, the ranking module 84 selects one the storage pools 86, which is the target for a set of encoded data slices.

The DAP 80 may further be used to identify a set of storage units, an individual storage unit, and/or a memory device within the storage unit. To achieve different output results, the coefficients are changed according to the desired location information. The DAP 80 may also output the ranked ordering of the scores.

Figure 10:
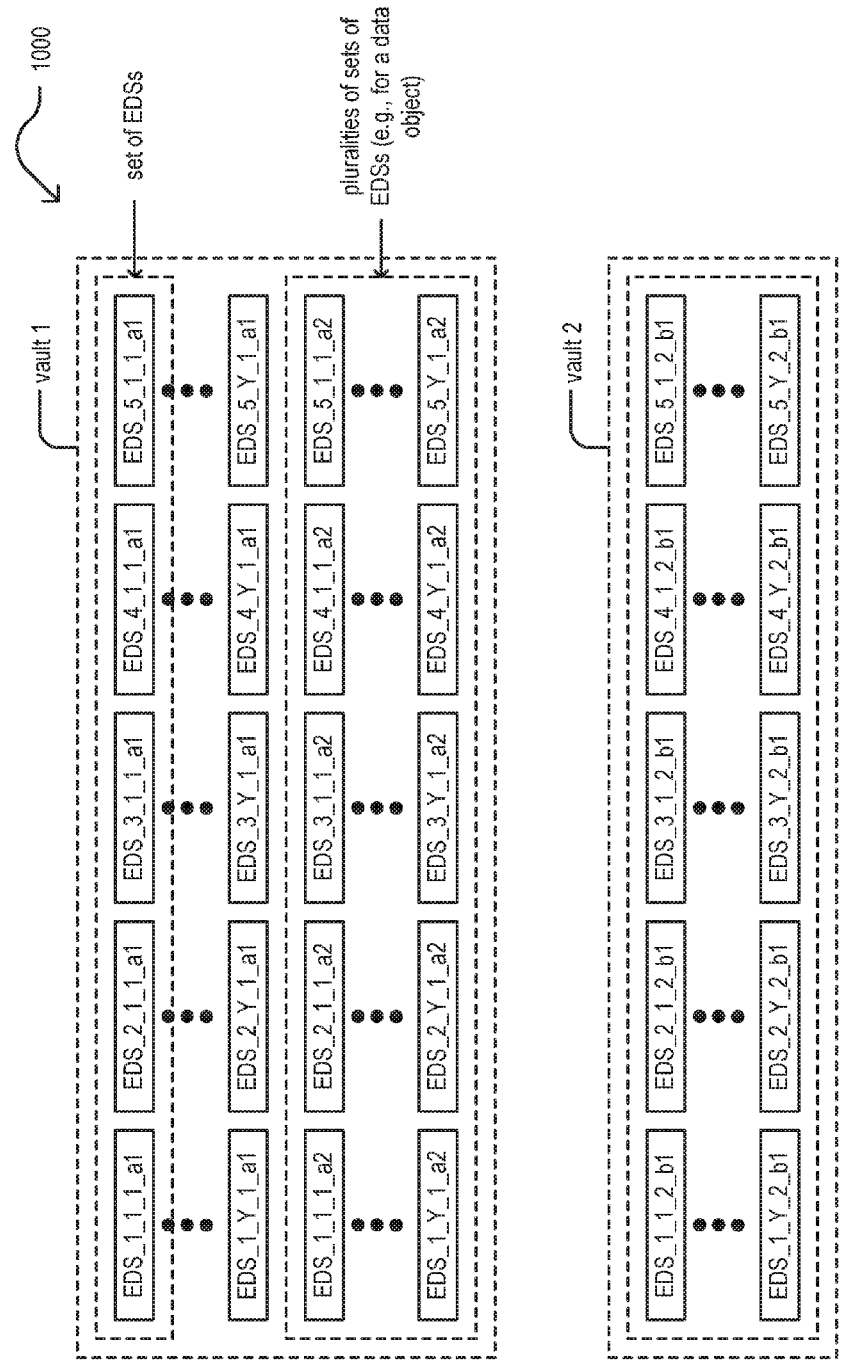
FIG. 10 is a schematic block diagram of an example of creating pluralities of sets of slices in accordance with the present invention.

FIG. 10 is a schematic block diagram 1000 of an example of creating pluralities of sets of slices. Each plurality of sets of encoded data slices (EDSs) corresponds to the encoding of a data object, a portion of a data object, or multiple data object, where a data object is one or more of a file, text, data, digital information, etc. For example, the highlighted plurality of encoded data slices corresponds to a data object having a data identifier of "a2".

Each encoded data slices of each set of encoded data slices is uniquely identified by its slice name, which is also used as at least part of the DSN address for storing the encoded data slice. As shown, a set of EDSs includes EDS 1_1_1_a1 through EDS 5_1_1_a1. The EDS number includes pillar number, data segment number, vault ID, and data object ID. Thus, for EDS 1_1_1_a1, it is the first EDS of a first data segment of data object "a1" and is to be stored, or is stored, in vault 1. Note that vaults are a logical memory container supported by the storage units of the DSN. A vault may be allocated to one or more user computing devices.

As is further shown, another plurality of sets of encoded data slices are stored in vault 2 for data object "b1". There are Y sets of EDSs, where Y corresponds to the number of data segments created by segmenting the data object. The last set of EDSs of data object "b1" includes EDS 1_Y_2_b1 through EDS 5_Y_2_b1. Thus, for EDS 1_Y_2_b1, it is the first EDS of the last data segment "Y" of data object "b1" and is to be stored, or is stored, in vault 2.

Figure 11:
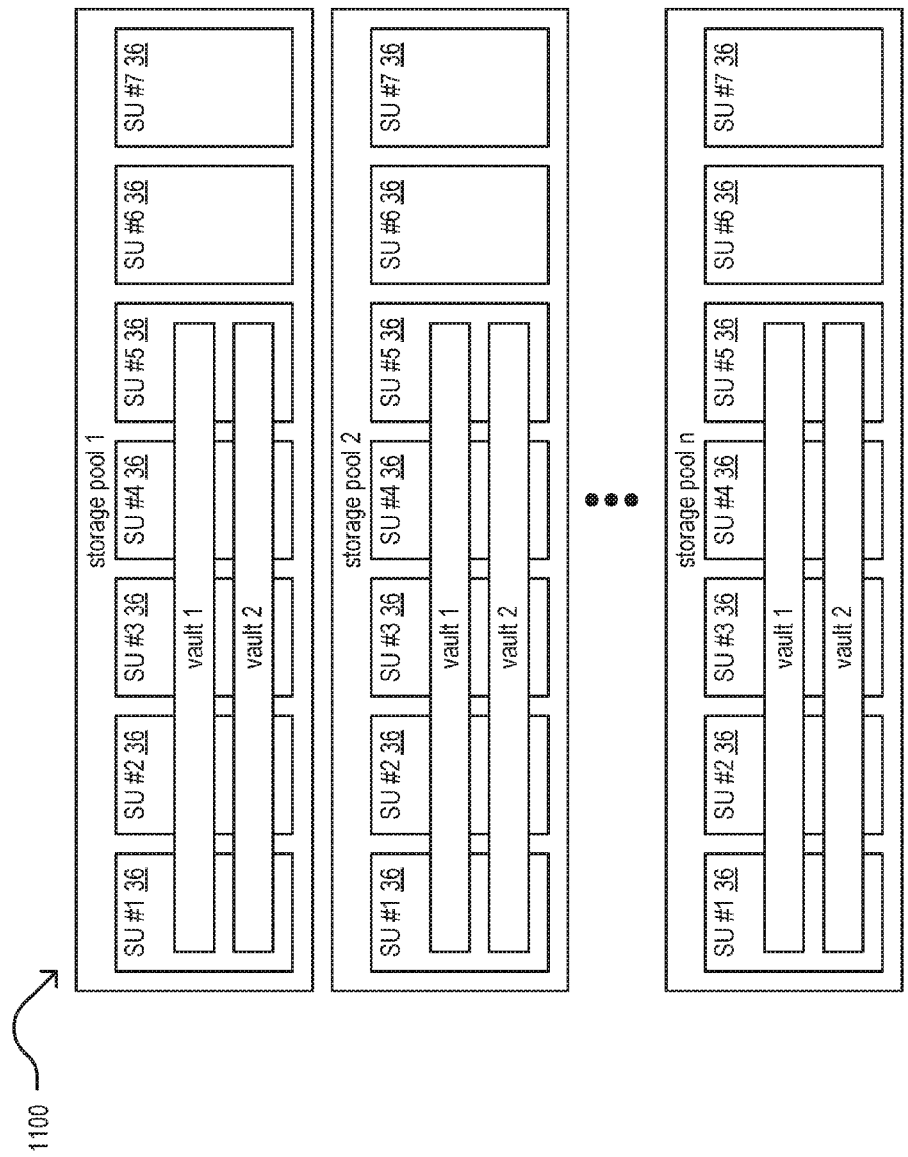
FIG. 11 is a schematic block diagram of an example of storage vaults in accordance with the present invention.

FIG. 11 is a schematic block diagram 1100 of an example of storage vaults spanning multiple storage pools. In this example, the DSN memory 22 includes a plurality of storage units 36 arranged into a plurality of storage pools (e.g., 1-n). In this example, each storage pool includes seven storage units for ease of illustration. A storage pool, however, can have many more storage units than seven and, from storage pool to storage pool, may have different numbers of storage units.

The storage pools 1-n support two vaults (vault 1 and vault 2) using only five of seven of the storage units. The number of storage units within a vault correspond to the pillar width number, which is five in this example. Note that a storage pool may have rows of storage units, where SU #1 represents a plurality of storage units, each corresponding to a first pillar number; SU #2 represents a second plurality of storage units, each corresponding to a second pillar number; and so on. Note that other vaults may use more or less than a width of five storage units.

Figure 12:
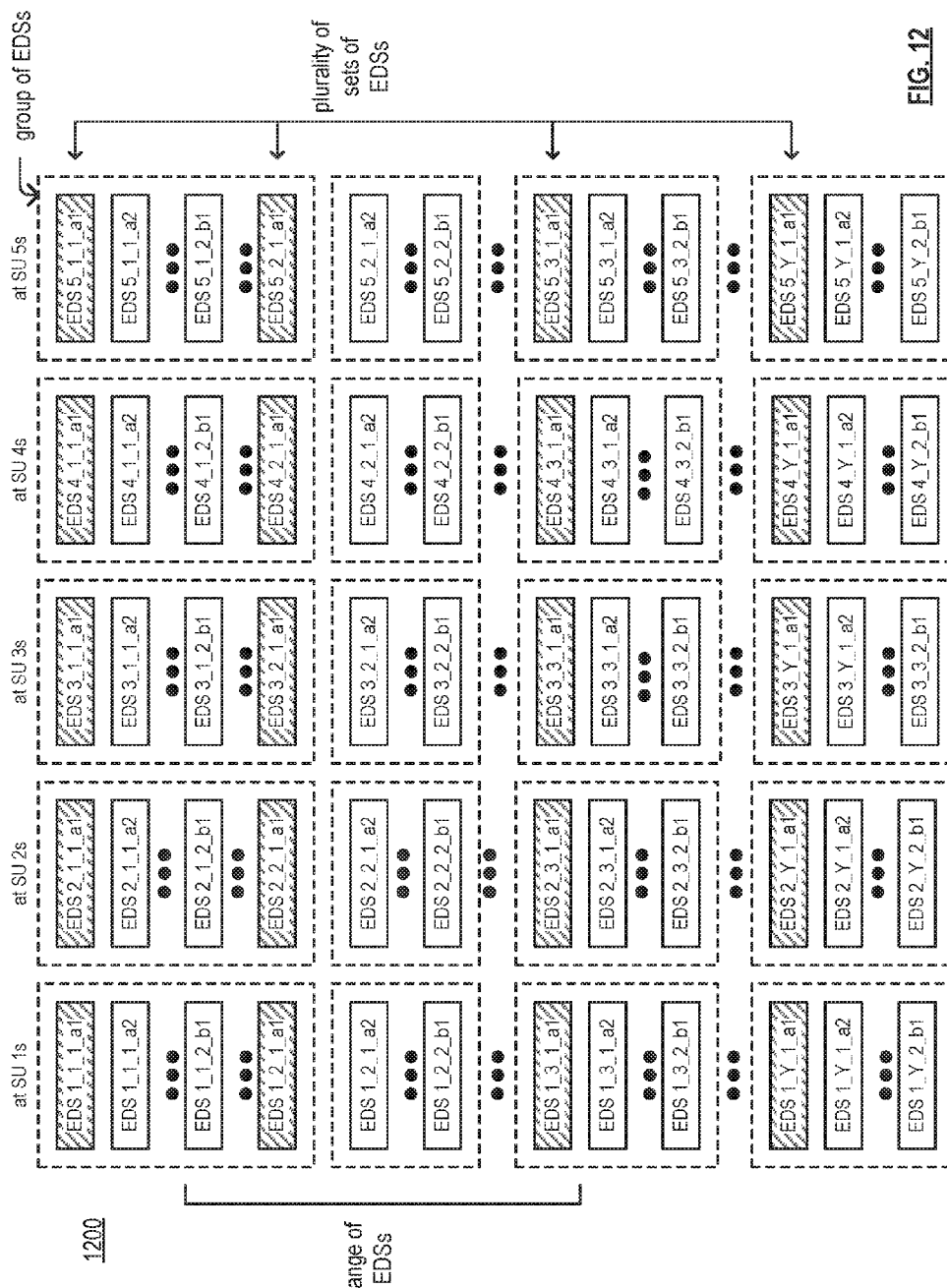
FIG. 12 is a schematic block diagram of an example of storing pluralities of sets of slices in accordance with the present invention.

FIG. 12 is a schematic block diagram 1200 of an example of storing pluralities of sets of slices in accordance with the Decentralized, or Distributed, Agreement Protocol (DAP) 80 of FIG. 9. The DAP 80 uses slice identifiers (e.g., the slice name or common elements thereof (e.g., the pillar number, the data segment number, the vault ID, and/or the data object ID)) to identify, for one or more sets of encoded data slices, a set, or pool, of storage units. With respect to the three pluralities of sets of encoded data slices (EDSs) of FIG. 11, the DAP 80 approximately equally distributes the sets of encoded data slices throughout the DSN memory (e.g., among the various storage units).

The first column corresponds to storage units having a designation of SU #1 in their respective storage pool or set of storage units and stores encoded data slices having a pillar number of 1. The second column corresponds to storage units having a designation of SU #2 in their respective storage pool or set of storage units and stores encoded data slices having a pillar number of 2, and so on. Each column of EDSs is divided into one or more groups of EDSs. The delineation of a group of EDSs may correspond to a storage unit, to one or more memory devices within a storage unit, or multiple storage units. Note that the grouping of EDSs allows for bulk addressing, which reduces network traffic.

A range of encoded data slices (EDSs) spans a portion of a group, spans a group, or spans multiple groups. The range may be numerical range of slice names regarding the EDSs, one or more source names (e.g., common aspect shared by multiple slice names), a sequence of slice names, or other slice selection criteria.

Figure 13:
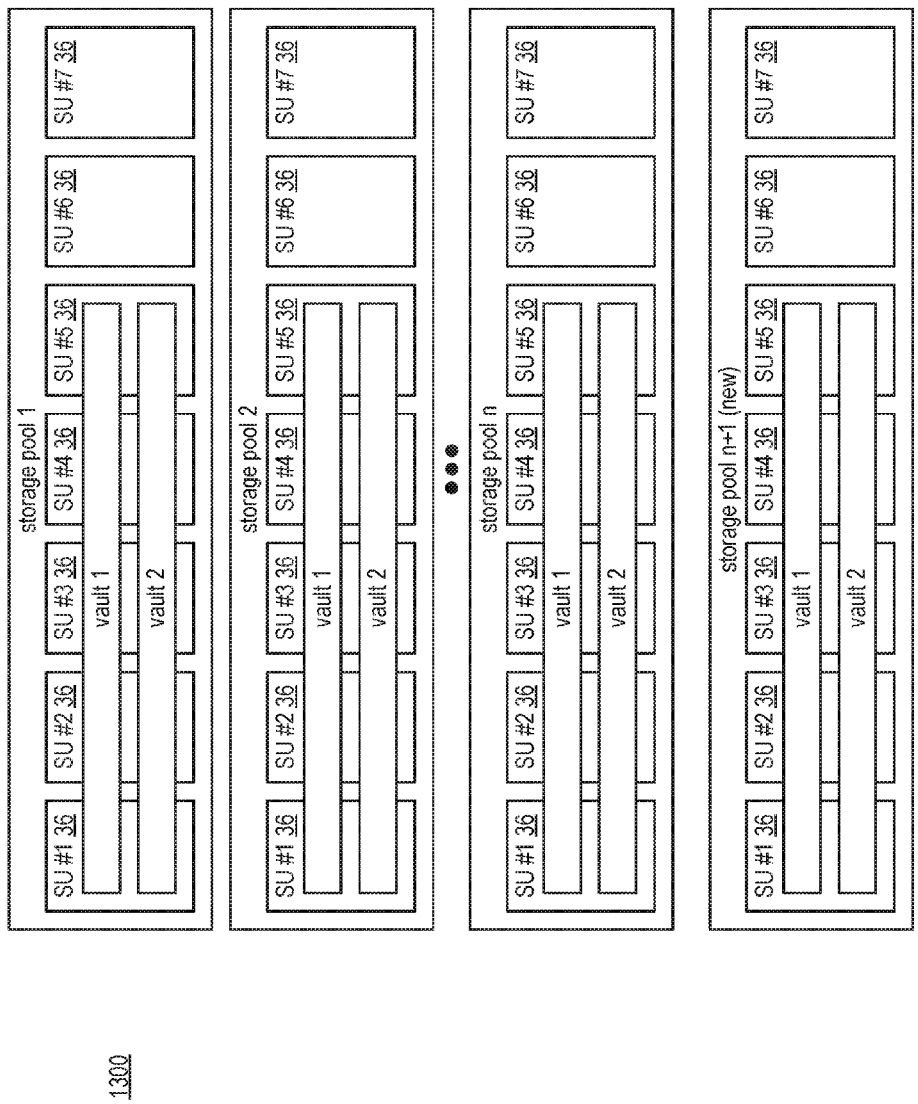
FIG. 13 is a schematic block diagram of an example of adding a storage pool to the DSN in accordance with the present invention.

FIG. 13 is a schematic block diagram 1300 of an example of adding a storage pool to the DSN. In this example storage pool n+1 is added and is supporting vaults 1 and 2. As result, the Decentralized, or Distributed, Agreement Protocol (DAP) 80 of FIG. 9 is changed to include another functional rating module 81 for the new storage pool and the second coefficients (e.g., "b", which correspond to the weight factor) are adjusted for some, if not all, of the other functional rating modules 81. As a result of changing the DAP 80, storage responsibility for encoded data slices is going to change, causing them to be transferred between the storage units. When there are significant numbers of encoded data slices to be transferred and there are hundreds to tens of thousands of resources in the DSN (e.g., computing devices, storage units, managing units, integrity units performing rebuilding, etc.), the updating of the DSN is complex and time consuming.

While the DSN is being updated based on the new DAP, data access requests, listing requests, and other types of requests regarding the encoded data slices are still going to be received and need to be processed in a timely manner. Such requests will be based on the old DAP. As such, a request for an encoded data slice (EDS), or information about the EDS, will go to the storage unit identified using the DAP 80 prior to updating it. If the storage unit has already transferred the EDS to the storage unit identified using the new DAP 80, then the storage unit functions as proxy for the new storage unit and the requesting device.

Figure 14:
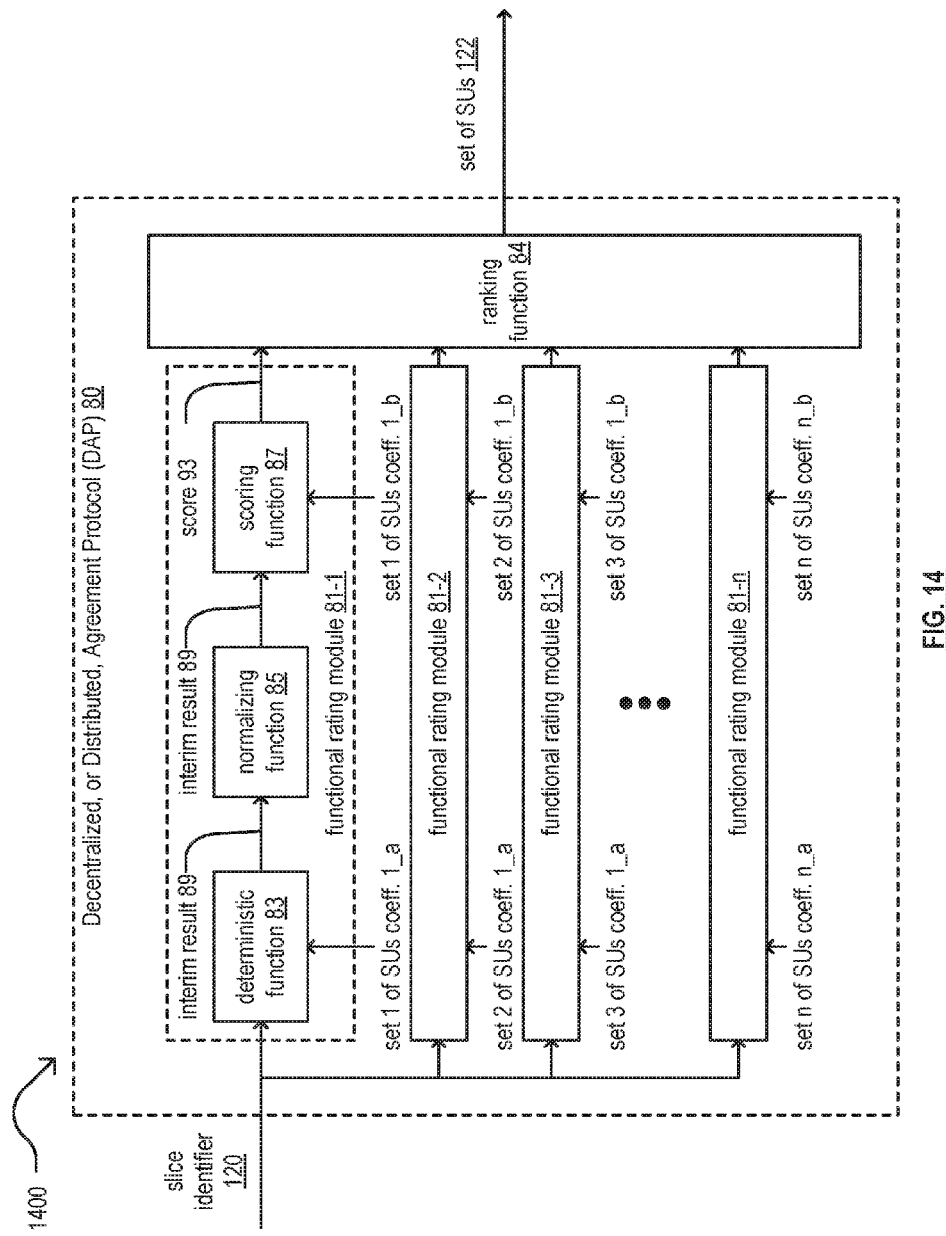
FIG. 14 is a schematic block diagram of an embodiment of a decentralized, or distributed, agreement protocol (DAP) for generating identified set of storage units in accordance with the present invention.

FIG. 14 is a schematic block diagram 1400 of an embodiment of a decentralized, or distributed, agreement protocol (DAP) for generating identified set of storage units in accordance with the present invention. The DAP 80 is similar to the DAP of FIG. 9, but uses a slice identifier 120 instead of a source name 82, uses coefficients for a set of storage units instead of for individual storage units, and the ranking function 84 outputs an identified set of storage units 122 instead of a storage unit ranking 86. The slice identifier 120 corresponds to a slice name or common attributes of set of slices names. For example, for a set of encoded data slices, the slice identifier 120 specifies a data segment number, a vault ID, and a data object ID, but leaves open ended, the pillar number.

In an example of the operation, each of the functional rating modules 81 generates a score 93 for each set of the storage units based on the slice identifier 120. The ranking function 84 orders the scores 93 to produce a ranking. But, instead of outputting the ranking, the ranking function 84 outputs one of the scores, which corresponds to the identified set of storage units.

As can be seen, such a DAP may be implemented and executed for many different applications including for the determination of where to store encoded data slices or where to find stored encoded data slices such as with respect to FIG. 9 as well as the identification of a set of storage units (SUs) such as with respect to FIG. 14. Based on differently provided input to the DAP, differently provided information may be output. Generally speaking, the more detailed information is that is provided to the DAP, then the more detailed information will be output when from the DAP when executed.

Figure 15:
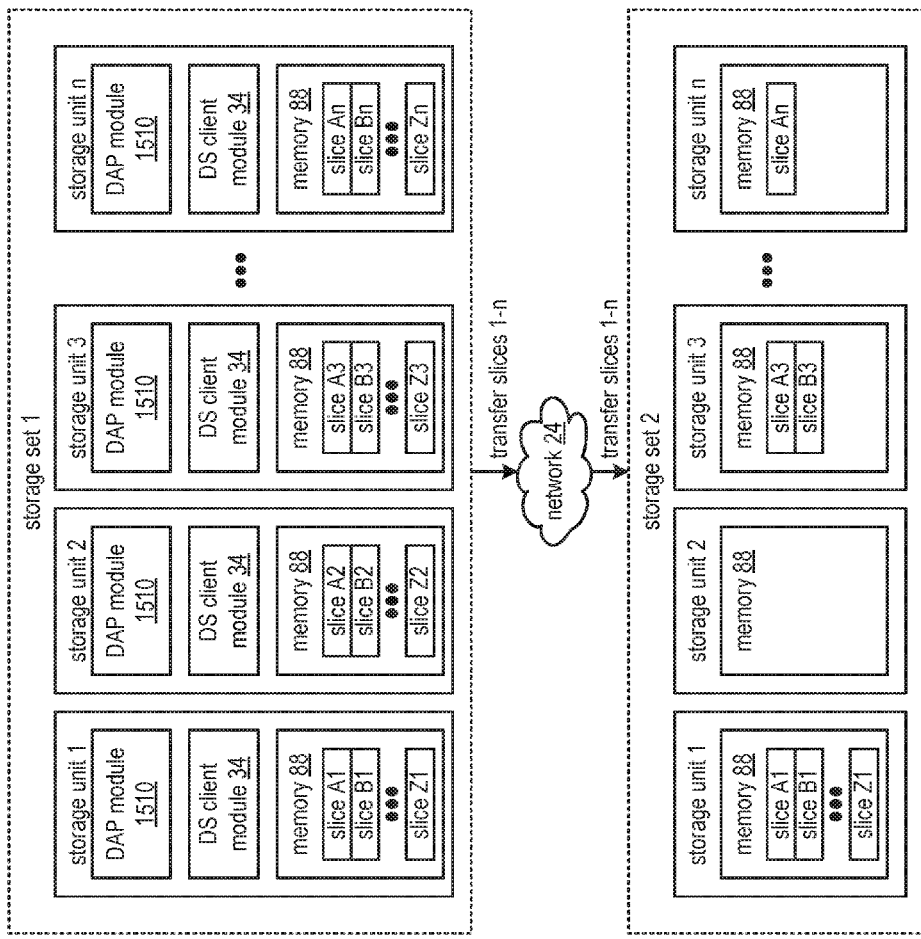
FIG. 15 is a schematic block diagram of another example of dispersed storage network (DSN) in accordance with the present invention.

FIG. 15 is a schematic block diagram of another example 1500 of dispersed storage network (DSN) in accordance with the present invention. This diagram of a DSN includes two or more storage sets 1-2, and the network 24 of FIG. 1. Each storage set includes a set of storage units 1-n. Each storage unit may include a Decentralized, or Distributed, Agreement Protocol (DAP) module 1510 that may be implemented based on the DAP 80 of FIG. 9 or FIG. 14, the distributed storage (DS) client module 34 of FIG. 1, and a memory 88. The DAP module 1510 may be implemented utilizing a DAP such as based on the DAP 80 of FIG. 9 or FIG. 14. Each storage unit may be implemented utilizing the a DS execution unit, a computing device 12 or 16 such as of FIG. 1, FIG. 3, or FIG. 7, a storage unit (SU) 36 such as described herein, and/or any other device implemented to performed such operations and functions. The DSN functions to transfer encoded data slices from one storage set to another storage set (e.g., from storage set 1 to storage set 2 via network 24).

In an example of operation and implementation of the transferring of encoded data slices (EDSs), a storage unit of the storage set 1 detects a weight change for storage unit associated with storage of an encoded data slice, where a distributed agreement protocol function is performed on a slice name of the encoded data slice for a plurality of storage units of the DSN utilizing a weights and identifiers associated with each of the storage units to produce scoring information, and where a storage unit associated with a highest score is selected for storage of the encoded data slice. The detecting includes receiving an updated weight for the storage unit for the slice name and interpreting updated system registry information. For example, the storage unit 1 receives a weight update for storage unit 1 with respect to the stored encoded data slices A1, B1, through Z1.

Having detected the weight change, the storage unit determines whether storage utilization of the storage unit compares unfavorably to a storage utilization threshold level. For example, the storage unit indicates an unfavorable comparison when the storage utilization is greater than the storage utilization threshold level.

When the storage utilization compares unfavorably to the storage utilization threshold level, the storage unit performs the distributed agreement protocol function on the slice name of the encoded data slice for each storage set and/or storage unit of the DSN to produce scoring information. For example, the DS client module 34 of the storage unit 1 utilizes the decentralized agreement module of the storage unit 1 to perform the distributed agreement protocol function on the slice name associated with the encoded data slice A1 (e.g., utilizing updated weights associated with the detected weight change for the storage units) to produce the scoring information.

Having produced the scoring information, the storage unit facilitates transfer of encoded data slice from the storage unit to another storage unit associated with a highest score of the scoring information when the storage unit is not associated with a highest score. For example, the storage unit of the storage set 1 facilitates transfer, via the network 24, of the encoded data slice A1 as a transfer slice 1 to the storage unit 1 of the storage set 2 for storage in the memory 88 of the storage unit 1 of the storage set 2 when the storage unit 1 and the storage set 2 is associated with the highest score of the scoring information, etc.

Figure 16:
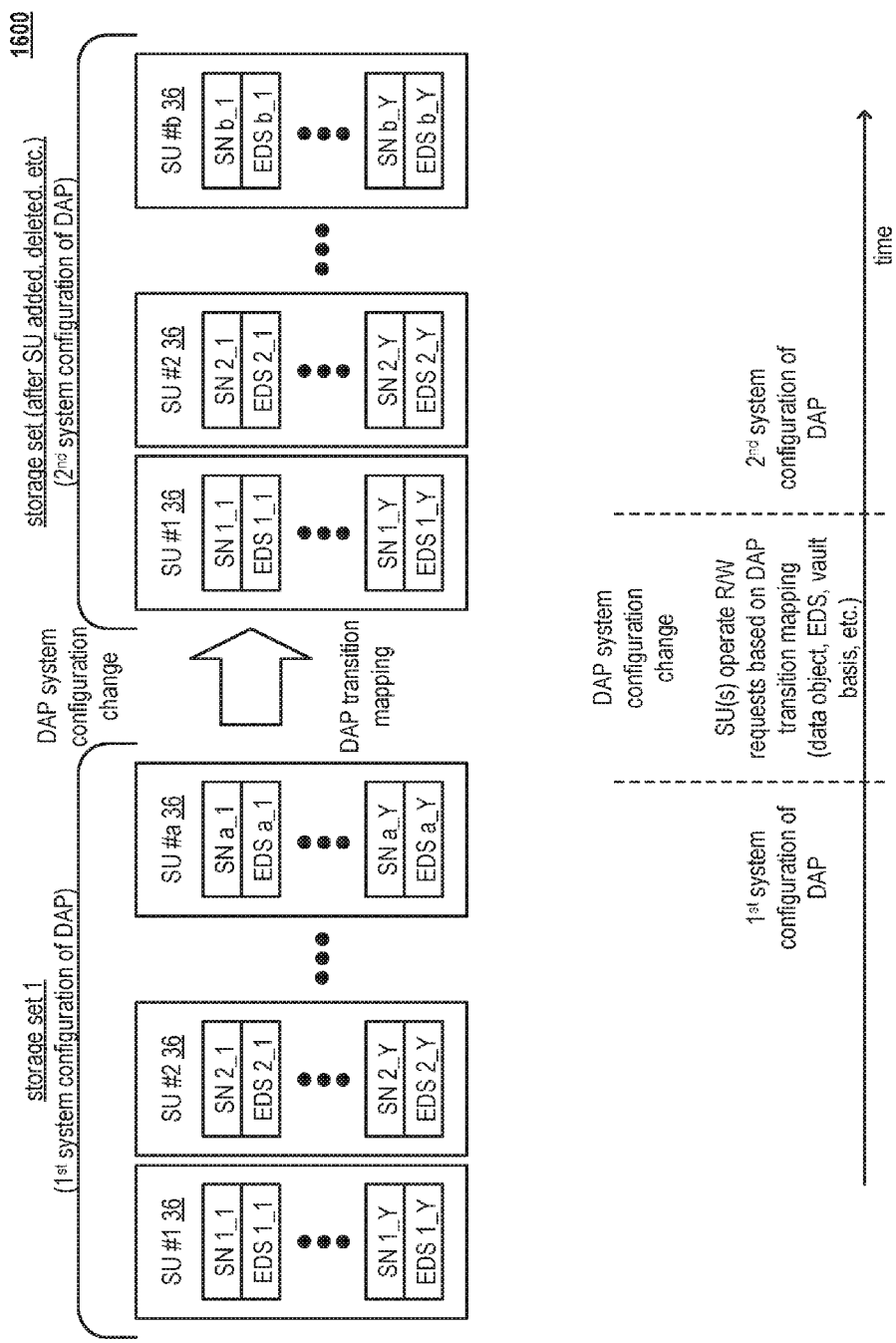
FIG. 16 is a schematic block diagram of an example of dispersed storage network (DSN) undergoing a DAP system configuration change in accordance with the present invention.

FIG. 16 is a schematic block diagram of an example 1600 of dispersed storage network (DSN) undergoing a DAP system configuration change in accordance with the present invention. A computing device includes an interface configured to interface and communicate with a dispersed storage network (DSN), a memory that stores operational instructions, and a processing module operably coupled to the interface and memory such that the processing module, when operable within the computing device based on the operational instructions, is configured to perform various operations. When a is to DSN undergo a change from a first system configuration of a Decentralized, or Distributed, Agreement Protocol (DAP) to a second system configuration of the DAP (e.g., such as based on addition, and/or removal of storage unit(s) (SU(s)) within the DSN or reallocation of data within the DSN, etc.), a computing device identifies a DAP transition mapping between the first system configuration of the DAP to the second system configuration of the DAP. Then, the computing device directs SU(s) to operate based on the DAP transition mapping during the transition.

An example of operation based on the DAP transition mapping may be as follows: a read request is transmitted from a first device already updated to the second system configuration of the DAP to a second device that has not yet updated from the first system configuration of the DAP to the second system configuration of the DAP, then the servicing device (second device) can translate between the two system configurations of the DAP (e.g., based on the DAP transition mapping) to service the read request appropriately and give the respond in the format needed by the requesting device (e.g., first device) in the format it currently needs and based on its current system configuration of the DAP. During the transition of the DAP from the first system configuration of the DAP to the second system configuration of the DAP, the respective devices may be serviced (e.g., for read and/or write requests) based on the current system configuration of the DAP of those devices regardless of other devices have already updated from the from the first system configuration of the DAP to the second system configuration of the DAP. The DAP transition mapping allows for the ongoing servicing of various operations (e.g., for read and/or write requests) during such a soft or gradual transition of the DAP from the first system configuration of the DAP to the second system configuration of the DAP and still provide the various devices information in the format that they require based on their current system configuration of the DAP. Once all devices have updated from the first system configuration of the DAP to the second system configuration of the DAP, the DAP transition mapping will no longer be needed since all devices will not be operating based on the second system configuration of the DAP.

In an example of operation and implementation, a computing device (e.g., a DS processing unit (or computing device) 12 or 16, a SU, and/or any other device so implemented) detects a change within the DSN from a first system configuration of a Decentralized, or Distributed, Agreement Protocol (DAP) to a second system configuration of the DAP for at least one reason (e.g., based on addition, removal of at least one storage unit (SU) within a plurality of storage units (SUs) within the DSN, and/or reallocation of data within the DSN). Note that the first system configuration of the DAP and the second system configuration of the DAP respectively provide for deterministic calculation of locations of encoded data slice (EDS) sets that correspond respectively to a plurality of data segments of a data object that are distributedly stored among the plurality of storage units SUs within the DSN. Such a data object is segmented into the plurality of data segments, and a data segment of the plurality of data segments is dispersed error encoded in accordance with dispersed error encoding parameters to produce a set of EDSs of the EDS sets.

The computing device then identifies a DAP transition mapping between the first system configuration of the DAP to the second system configuration of the DAP. Once this mapping between the first system configuration of the DAP to the second system configuration of the DAP is known, the computing device then directs at least one SU to service at least one of a first read request or a first write request from a first other computing device for at least one EDS stored within the at least one SU based on the DAP transition mapping during transition from the first system configuration of the DAP to the second system configuration of the DAP; and the computing device then directs the at least one SU to service other read request(s) and/or write request(s) from the other computing device or even another computing device for the at least one EDS stored within the at least one SU based on the second system configuration of the DAP after completion of the transition from the first system configuration of the DAP to the second system configuration of the DAP.

A timeline is shown near the bottom of the diagram in which operation is made based on a given system configuration of the DAP. Initially, the SUs of the DSN operate based on a first system configuration of the DAP. Then, when a change within the DSN from a first system configuration of a DAP to a second system configuration of the DAP for at least one reason (e.g., based on addition, removal of at least one SU within a plurality of SUs within the DSN, and/or reallocation of data within the DSN), the SUs of the DSN operate based on the DAP transition mapping during transition from the first system configuration of the DAP to the second system configuration of the DAP. Then, once the DAP system configuration has completed, the SUs of the DSN operate based on the second system configuration of the DAP For example, transition of the various elements, components, etc. of the DSN may be updated from the first system configuration of the DAP to the second system configuration of the DAP at or during different times. This may be performed on a data object by data object basis, a vault by vault basis, an EDS set by EDS set basis, a SU by SU basis, a storage set by storage set basis, etc. and/or any other basis as may be desired. In addition, various types of transitions may be performed at various locations, within various devices, etc. within a DSN (e.g., data object by data object basis within a first storage set, vault by vault basis for a different set of SUs, etc.). Moreover, different data may be categorized based on the amount of time that it gets stored, the type of data (e.g., data, media such as video, photographic, and/or audio, etc., text files, etc.), among other bases. For example, if a data object is often edited and changed (e.g., a word processing file, a scratchpad filed), then it may be categorized in one category. For example, if a data object is seldom or never edited and changed (e.g., a photo, a video, etc.), then it may be categorized in another category. Depending on the category into which a data file is placed, the time at or during which the data object gets updated from the first system configuration of the DAP to the second system configuration of the DAP may be adapted (e.g., updated soon within the DAP system configuration transition for a data object is often edited and changed, updated later within the DAP system configuration transition for a data object is often edited and changed, etc. or vice versa).

In an example of operation and implementation, instead of doing an immediate or fast transition from the first system configuration of the DAP to the second system configuration of the DAP, the transition may be performed based on a soft or gradual transition. As the transition may take a period of time and be on an element by element basis (e.g., data object by data object basis within a first storage set, vault by vault basis for a different set of SUs, etc.), the DAP transition mapping between the first system configuration of the DAP and the second system configuration of the DAP allows those devices not yet updated to continue to service read and/or write request(s) during the soft or gradual transition.

In some examples, the computing device directs a subset of SUs within the plurality of SUs that store the EDS sets that correspond respectively to the plurality of data segments of the data object to service a first other read request and/or a first other write request from a first other computing device for at least one EDS of the EDS sets based on the DAP transition mapping during transition from the first system configuration of the DAP to the second system configuration of the DAP when performed on a data object-by-data object basis, and the computing device directs subset of SUs within the plurality of SUs that store the EDS sets that correspond respectively to the plurality of data segments of the data object to service a second other read request and/or a second other write request from the first other computing device and/or a second other computing device for the at least one EDS of the EDS sets based on the second system configuration of the DAP after completion of the transition of the subset of SUs within the plurality of SUs from the first system configuration of the DAP to the second system configuration of the DAP.

In another example, the computing device directs a subset of SUs within the plurality of SUs that store an EDS set of the EDS sets that correspond respectively to the plurality of data segments of the data object to service a first other read request and/or a first other write request from the first other computing device for at least one EDS of the EDS set of the EDS sets based on the DAP transition mapping during transition from the first system configuration of the DAP to the second system configuration of the DAP when performed on an EDS set-by-EDS set basis, and the computing device directs the subset of SUs within the plurality of SUs that store the EDS set of the EDS sets that correspond respectively to the plurality of data segments of the data object to service a second other read request and/or a second other write request from the first other computing device and/or a second other computing device for the at least one EDS of the EDS set of the EDS sets based on the second system configuration of the DAP after completion of the transition of the subset of SUs within the plurality of SUs from the first system configuration of the DAP to the second system configuration of the DAP.

In even another example, the computing directs a subset of SUs within the plurality of SUs of a vault that store at least some of an EDS set of the EDS sets that correspond respectively to the plurality of data segments of the data object to service a first other read request and/or a first other write request from the first other computing device for at least one EDS of the EDS set of the EDS sets based on the DAP transition mapping during transition of the subset of SUs within the plurality of SUs of the vault from the first system configuration of the DAP to the second system configuration of the DAP when performed on a vault-by-vault basis, and the computing device directs the subset of SUs within the plurality of SUs of the vault that store the at least some of the EDS set of the EDS sets that correspond respectively to the plurality of data segments of the data object to service a second other read request and/or a second other write request from the first other computing device and/or a second other computing device for the at least some of the EDS set of the EDS sets based on the second system configuration of the DAP after completion of the transition from the first system configuration of the DAP to the second system configuration of the DAP.

In even another example, the computing directs the plurality of SUs to service any other read request or any other write request from a first other computing device and/or a second other computing device for any EDS within the EDS sets based on the second system configuration of the DAP after completion of transition of the plurality of SUs from the first system configuration of the DAP to the second system configuration of the DAP.

Note that the computing device may be located at a first premises that is remotely located from at least one SU of the primary SUs or plurality of secondary SUs the within the DSN. Also, note that the computing device may be of any of a variety of types of devices as described herein and/or their equivalents including a SU of the primary SUs or the secondary SUs within the DSN, a wireless smart phone, a laptop, a tablet, a personal computers (PC), a work station, and/or a video game device. Note also that the DSN may be implemented to include or be based on any of a number of different types of communication systems including a wireless communication system, a wire lined communication systems, a non-public intranet system, a public internet system, a local area network (LAN), and/or a wide area network (WAN).

Figure 17:
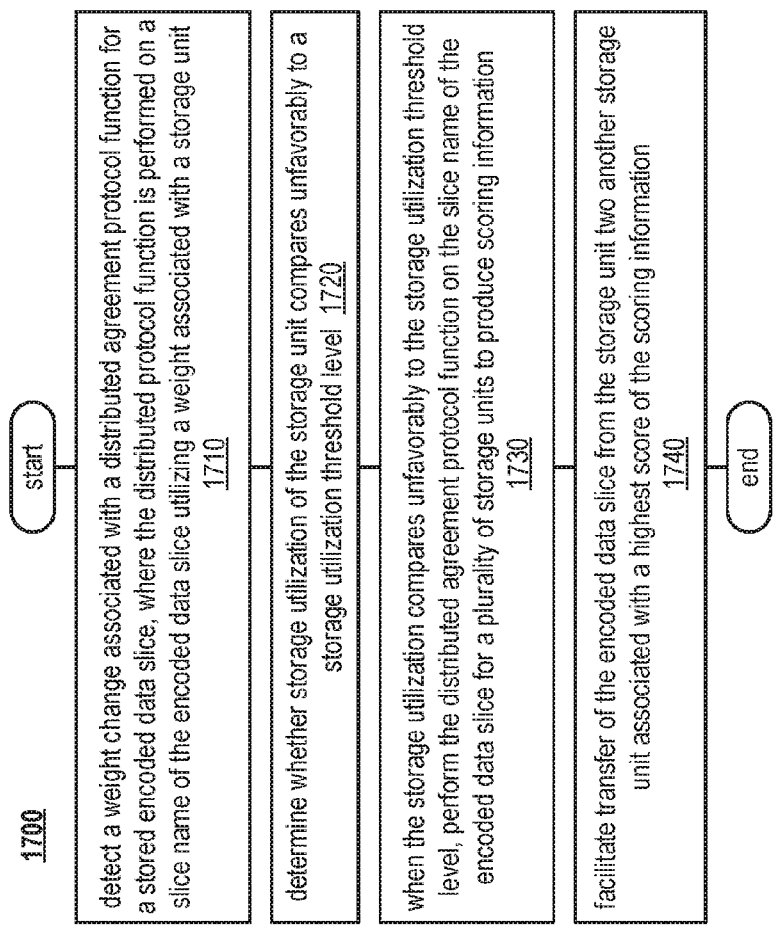
FIG. 17 is a diagram illustrating an embodiment of a method for execution by one or more computing devices in accordance with the present invention.

FIG. 17 is a diagram illustrating an embodiment of a method 1700 for execution by one or more computing devices in accordance with the present invention. This diagram shows an example of transferring encoded data slices (EDSs). The method includes a step 1710 where a processing module of one or more processing modules of one or more computing devices (e.g., of a storage unit) detects a weight change associated with a distributed agreement protocol function for a stored encoded data slice, where the distributed protocol function is performed on a slice name of the encoded data slice utilizing a weight associated with the storage unit. For example, the processing module receives an updated weight for the storage unit for the slice name.

The method continues at the step 1720 where the processing module determines whether storage utilization of the storage unit compares unfavorably to a storage utilization threshold level. The determining includes one or more of comparing the storage utilization to the storage utilization threshold level indicating an unfavorable comparison when the storage utilization is greater than the storage utilization threshold level, and obtaining a wait timeframe prior to transferring the encoded data slice identify for transfer. The obtaining includes one or more of calculating based on one or more of a dispersed storage network (DSN) performance level, a storage unit utilization level, a DSN activity level, and a request; interpreting system registry information, and receiving the wait timeframe.

When the storage utilization compares unfavorably to the storage utilization threshold level, the method continues at the step 1730 where the processing module performs the distributed agreement protocol function on the slice name of the encoded data slice for a plurality of storage units to produce scoring information. For example, the processing module performs the distributed agreement protocol function on the slice name of the encoded data slice for each storage set and/or storage unit of the DSN to produce the scoring information.

The method continues at the step 1740 where the processing module facilitates transfer of the encoded data slice from the storage unit to another storage unit associated with a highest score of the scoring information. For example, the processing module retrieves the encoded data slice and sends the retrieved encoded data slices a transfer slice to the other storage unit for storage.

Figure 18:
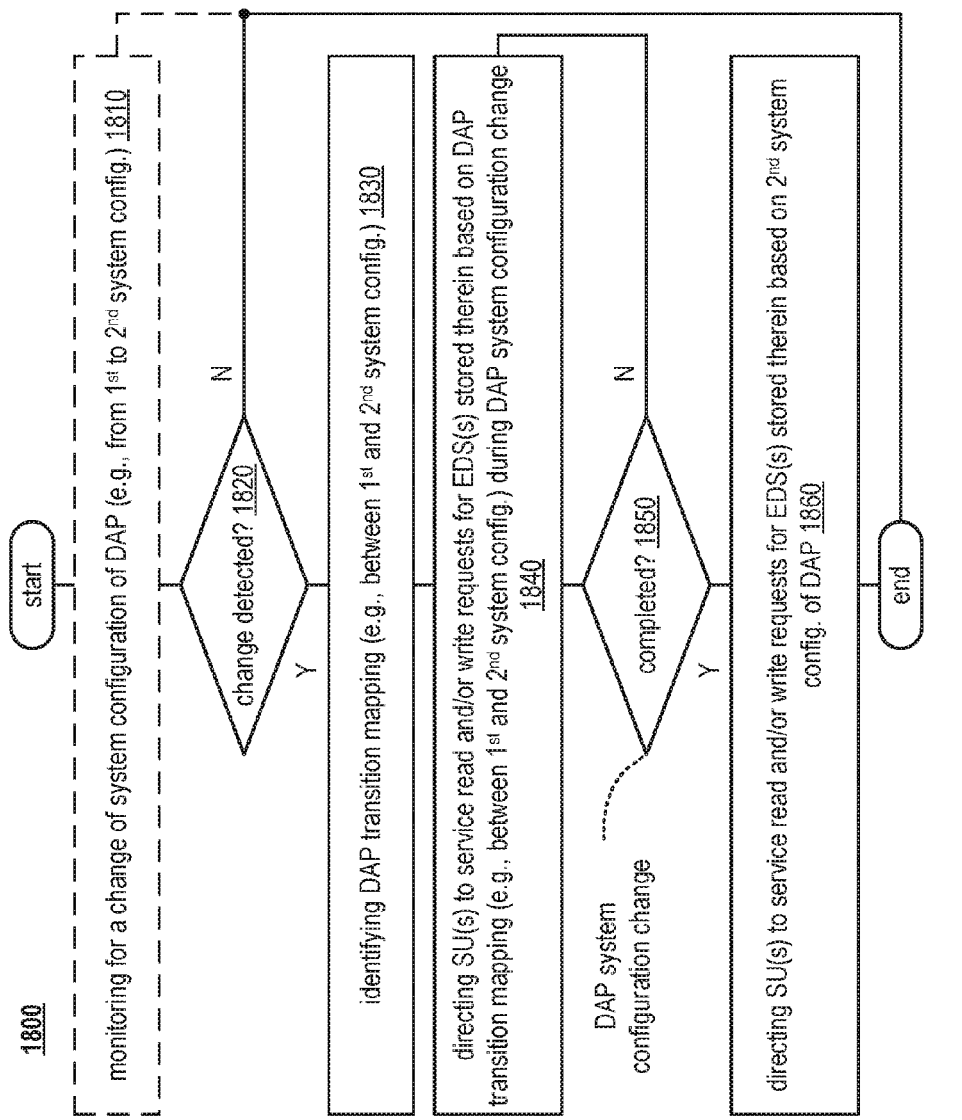
FIG. 18 is a diagram illustrating another embodiment of a method for execution by one or more computing devices in accordance with the present invention.

FIG. 18 is a diagram illustrating another embodiment of a method 1800 for execution by one or more computing devices in accordance with the present invention. In some optional examples, the method 1800 operates by monitoring for a change of system configuration of the DAP (e.g., from a first to a second system configuration of the DAP) (block 1810). Alternatively, the method 1800 may operate by receiving a notification of a change of system configuration of the DAP. In another example, the method 1800 may operate by polling another device for information regarding a change of system configuration of the DAP. Regardless of the manner by which the method 1800 is informed of a change of system configuration of the DAP, the method 1800 operates by detecting a change from a first system configuration of a Decentralized, or Distributed, Agreement Protocol (DAP) to a second system configuration of the DAP to a second system configuration of the DAP. Such a change may be precipitated based on addition or removal of at least one SU within a plurality of SUs within the DSN (e.g., within a storage pool of the DSN).

When the method 1800 operates by detecting no change of from a first system configuration of the DAP to a second system configuration of the DAP to a second system configuration of the DAP (block 1820), the method 1800 ends or continues monitoring for a change, update, etc. (e.g., loops back to block 1810). Alternatively, when the method 1800 operates by detecting a change of from the first system configuration of the DAP to the second system configuration of the DAP to a second system configuration of the DAP (block 1820), the method 1800 operates by identifying a DAP transition mapping between the first system configuration of the DAP to the second system configuration of the DAP (block 1830).

The method 1800 then operates by directing (e.g., via an interface of a computing device,) at least one SU to service read request(s) and/or write request(s) from another computing device for at least one EDS stored within at least one SU based on the DAP transition mapping during transition from the first system configuration of the DAP to the second system configuration of the DAP (block 1840).

The method 1800 then operates by monitoring whether the transition from the first system configuration of the DAP to the second system configuration of the DAP is still ongoing or completed (block 1850). When the DAP system configuration has not yet been completed and is still ongoing (block 1850), the method 1800 operates by continuing to perform the operation(s) associated with block 1840.

When the DAP system configuration has been completed (block 1850), the method 1800 operates by directing (e.g., via the interface of the computing device) the at least one SU to service read request(s) and/or write request(s) from at least one of the other computing device or even yet another computing device for the at least one EDS stored within the at least one SU based on the second system configuration of the DAP after completion of the transition from the first system configuration of the DAP to the second system configuration of the DAP (block 1860).

This disclosure provides for a Decentralized, or Distributed, Agreement Protocol (DAP) that may be used to expand the storage capacity of memory within a dispersed storage network (DSN) by such as adding a new SU and/or one or more new sets of SUs to an existing storage pool. The pre-existing DS units (e.g., computing devices, SUs, etc.) that hold EDSs then apply the DAP to determine which sources ought to be moved to the newly added set of DS units (e.g., computing devices, SUs, etc.). However, the effort of transmitting these EDSs to the new locations may be wasted effort of the EDSs are soon-to-be deleted anyway. For example, in a DSN memory where data is constantly being deleted shortly after it is written (e.g., a high churn), there is little benefit in reallocating data to the new location since the existing "delete/write new" workflow will naturally achieve balanced utilization once all pre-existing data has been deleted. For such situations, an alternate strategy for applying the DAP may be used in cases of growing the system:

Rather than pro-actively reallocating data to the new sets, the data may be reallocated in a soft or gradual transition. Such a soft or gradual transition or reallocation may: 1. reallocate data at a reduced rate, 2. reallocate data only when the system has nothing else or better to do, and/or 3. reallocate data only as necessary to prevent running out of capacity.

To implement this third strategy above, a set of DS units (e.g., computing devices, SUs, etc.) may be configured with a utilization threshold, (e.g. 95%) which when exceeded will trigger reallocation of excess EDSs to at least one of the more recently added sets of DS units (e.g., computing devices, SUs, etc.). In an example, when utilization remains above the utilization threshold, the reallocation will proceed; alternatively, when it is below, the reallocation will cease. Alternatively, some combination of the above, or perhaps all 3 of the strategies may be used, such that it reallocates at a high rate when the utilization threshold is exceeded, at a medium rate when the system is otherwise idle, and at a low rate when the utilization threshold is not exceeded and the system is not idle. This minimizes the amount of reallocation to close to the minimum required as necessary, and further reduces the impact to the system that reallocation would otherwise bring.

It is noted that terminologies as may be used herein such as bit stream, stream, signal sequence, etc. (or their equivalents) have been used interchangeably to describe digital information whose content corresponds to any of a number of desired types (e.g., data, video, speech, audio, etc. any of which may generally be referred to as 'data').

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A computing device comprising:
an interface configured to interface and communicate with a dispersed storage network (DSN);
memory that stores operational instructions; and
a processing module operably coupled to the interface and to the memory, wherein the processing module, when operable within the computing device based on the operational instructions, is configured to:
detect a change within the DSN from a first system configuration of a Decentralized, or Distributed, Agreement Protocol (DAP) to a second system configuration of the DAP based on at least one of addition or removal of at least one storage unit (SU) within a plurality of storage units (SUs) within the DSN or reallocation of data within the DSN, wherein the first system configuration of the DAP and the second system configuration of the DAP respectively provide for deterministic calculation of locations of encoded data slice (EDS) sets that correspond respectively to a plurality of data segments of a data object that are distributedly stored among the plurality of storage units SUs within the DSN, wherein the data object is segmented into the plurality of data segments, wherein a data segment of the plurality of data segments is dispersed error encoded in accordance with dispersed error encoding parameters to produce a set of EDSs of the EDS sets;
identify a DAP transition mapping between the first system configuration of the DAP to the second system configuration of the DAP;
direct at least one SU to service at least one of a first read request or a first write request from a first other computing device for at least one EDS stored within the at least one SU based on the DAP transition mapping during transition from the first system configuration of the DAP to the second system configuration of the DAP; and
direct the at least one SU to service at least one of a second read request or a second write request from at least one of the first other computing device or a second other computing device for the at least one EDS stored within the at least one SU based on the second system configuration of the DAP after completion of the transition from the first system configuration of the DAP to the second system configuration of the DAP.

2. The computing device of claim 1, wherein the processing module, when operable within the computing device based on the operational instructions, is further configured to:
direct a subset of SUs within the plurality of SUs that store the EDS sets that correspond respectively to the plurality of data segments of the data object to service at least one of a first other read request or a first other write request from the first other computing device for at least one EDS of the EDS sets based on the DAP transition mapping during transition from the first system configuration of the DAP to the second system configuration of the DAP when performed on a data object-by-data object basis; and
direct the subset of SUs within the plurality of SUs that store the EDS sets that correspond respectively to the plurality of data segments of the data object to service at least one of a second other read request or a second other write request from at least one of the first other computing device or the second other computing device for the at least one EDS of the EDS sets based on the second system configuration of the DAP after completion of the transition of the subset of SUs within the plurality of SUs from the first system configuration of the DAP to the second system configuration of the DAP.

3. The computing device of claim 1, wherein the processing module, when operable within the computing device based on the operational instructions, is further configured to:
direct a subset of SUs within the plurality of SUs that store an EDS set of the EDS sets that correspond respectively to the plurality of data segments of the data object to service at least one of a first other read request or a first other write request from the first other computing device for at least one EDS of the EDS set of the EDS sets based on the DAP transition mapping during transition from the first system configuration of the DAP to the second system configuration of the DAP when performed on an EDS set-by-EDS set basis; and direct the subset of SUs within the plurality of SUs that store the EDS set of the EDS sets that correspond respectively to the plurality of data segments of the data object to service at least one of a second other read request or a second other write request from at least one of the first other computing device or the second other computing device for the at least one EDS of the EDS set of the EDS sets based on the second system configuration of the DAP after completion of the transition of the subset of SUs within the plurality of SUs from the first system configuration of the DAP to the second system configuration of the DAP.

4. The computing device of claim 1, wherein the processing module, when operable within the computing device based on the operational instructions, is further configured to:

direct a subset of SUs within the plurality of SUs of a vault that store at least some of an EDS set of the EDS sets that correspond respectively to the plurality of data segments of the data object to service at least one of a first other read request or a first other write request from the first other computing device for at least one EDS of the EDS set of the EDS sets based on the DAP transition mapping during transition of the subset of SUs within the plurality of SUs of the vault from the first system configuration of the DAP to the second system configuration of the DAP when performed on a vault-by-vault basis; and direct the subset of SUs within the plurality of SUs of the vault that store the at least some of the EDS set of the EDS sets that correspond respectively to the plurality of data segments of the data object to service at least one of a second other read request or a second other write request from at least one of the first other computing device or the second other computing device for the at least some of the EDS set of the EDS sets based on the second system configuration of the DAP after completion of the transition from the first system configuration of the DAP to the second system configuration of the DAP.

5. The computing device of claim 1, wherein the processing module, when operable within the computing device based on the operational instructions, is further configured to:

direct the plurality of SUs to service any other read request or any other write request from at least one of the first other computing device or the second other computing device for any EDS within the EDS sets based on the second system configuration of the DAP after completion of transition of the plurality of SUs from the first system configuration of the DAP to the second system configuration of the DAP.

6. The computing device of claim 1, wherein the computing device is located at a first premises that is remotely located from at least one SU of the plurality of SUs within the DSN.

7. The computing device of claim 1 further comprising:
a SU of the plurality of SUs within the DSN, a wireless smart phone, a laptop, a tablet, a personal computers (PC), a work station, or a video game device.

8. The computing device of claim 1, wherein the DSN includes at least one of a wireless communication system, a wire lined communication systems, a non-public intranet system, a public internet system, a local area network (LAN), or a wide area network (WAN).

9. A computing device comprising:
an interface configured to interface and communicate with a dispersed storage network (DSN);
memory that stores operational instructions; and
a processing module operably coupled to the interface and to the memory, wherein the processing module, when operable within the computing device based on the operational instructions, is configured to:
detect a change within the DSN from a first system configuration of a Decentralized, or Distributed, Agreement Protocol (DAP) to a second system configuration of the DAP based on at least one of addition or removal of at least one storage unit (SU) within a plurality of storage units (SUs) within the DSN or reallocation of data within the DSN, wherein the first system configuration of the DAP and the second system configuration of the DAP respectively provide for deterministic calculation of locations of encoded data slice (EDS) sets that correspond respectively to a plurality of data segments of a data object that are distributedly stored among the plurality of storage units SUs within the DSN, wherein the data object is segmented into the plurality of data segments, wherein a data segment of the plurality of data segments is dispersed error encoded in accordance with dispersed error encoding parameters to produce a set of EDSs of the EDS sets;
identify a DAP transition mapping between the first system configuration of the DAP to the second system configuration of the DAP;
direct the plurality of SUs to service at least one of a first read request or a first write request from a first other computing device for at least one EDS within the EDS sets stored within the plurality of SUs based on at least one of a data object-by-data object basis, an EDS set-by-EDS set basis, or vault-by-vault basis and based on the DAP transition mapping during transition from the first system configuration of the DAP to the second system configuration of the DAP; and
direct the plurality of SUs to service at least one of a second read request or a second write request from at least one of the first other computing device or a second other computing device for the at least one EDS within the EDS sets stored within the plurality of SUs based on the second system configuration of the DAP after completion of the transition from the first system configuration of the DAP to the second system configuration of the DAP.

10. The computing device of claim 9, wherein the processing module, when operable within the computing device based on the operational instructions, is further configured to:

direct a first subset of the plurality of SUs to service the at least one of the first read request or the first write request from the first other computing device for the at least one EDS within the EDS sets stored within the plurality of SUs based on the data object-by-data object basis and based on the DAP transition mapping during transition from the first system configuration of the DAP to the second system configuration of the DAP; and direct a second subset of the plurality of SUs to service at least one of another read request or another write request from at least one of the first other computing device or the second other computing device for at least one of the EDS or at least one other EDS within the EDS sets stored within the plurality of SUs based on the EDS set-by-EDS set basis or the vault-by-vault basis and based on the DAP transition mapping during transition from the first system configuration of the DAP to the second system configuration of the DAP.

11. The computing device of claim 9, wherein the computing device is located at a first premises that is remotely located from at least one SU of the plurality of SUs within the DSN.

12. The computing device of claim 9 further comprising:
a SU of the plurality of SUs within the DSN, a wireless smart phone, a laptop, a tablet, a personal computers (PC), a work station, or a video game device.

13. The computing device of claim 9, wherein the DSN includes at least one of a wireless communication system, a wire lined communication systems, a non-public intranet system, a public internet system, a local area network (LAN), or a wide area network (WAN).

14. A method for execution by a computing device, the method comprising:
detecting, via an interface of the computing device configured to interface and communicate with a dispersed storage network (DSN), a change within the DSN from a first system configuration of a Decentralized, or Distributed, Agreement Protocol (DAP) to a second system configuration of the DAP based on at least one of addition or removal of at least one storage unit (SU) within a plurality of storage units (SUs) within the DSN or reallocation of data within the DSN, wherein the first system configuration of the DAP and the second system configuration of the DAP respectively provide for deterministic calculation of locations of encoded data slice (EDS) sets that correspond respectively to a plurality of data segments of a data object that are distributedly stored among the plurality of storage units SUs within the DSN, wherein the data object is segmented into the plurality of data segments, wherein a data segment of the plurality of data segments is dispersed error encoded in accordance with dispersed error encoding parameters to produce a set of EDSs of the EDS sets;

identifying a DAP transition mapping between the first system configuration of the DAP to the second system configuration of the DAP;

directing, via the interface of the computing device, at least one SU to service at least one of a first read request or a first write request from a first other computing device for at least one EDS stored within the at least one SU based on the DAP transition mapping during transition from the first system configuration of the DAP to the second system configuration of the DAP; and directing, via the interface of the computing device, the at least one SU to service at least one of a second read request or a second write request from at least one of the first other computing device or a second other computing device for the at least one EDS stored within the at least one SU based on the second system configuration of the DAP after completion of the transition from the first system configuration of the DAP to the second system configuration of the DAP.

15. The method of claim 14 further comprising:
directing a subset of SUs within the plurality of SUs that store the EDS sets that correspond respectively to the plurality of data segments of the data object to service at least one of a first other read request or a first other write request from the first other computing device for at least one EDS of the EDS sets based on the DAP transition mapping during transition from the first system configuration of the DAP to the second system configuration of the DAP when performed on a data object-by-data object basis; and directing the subset of SUs within the plurality of SUs that store the EDS sets that correspond respectively to the plurality of data segments of the data object to service at least one of a second other read request or a second other write request from at least one of the first other computing device or the second other computing device for the at least one EDS of the EDS sets based on the second system configuration of the DAP after completion of the transition of the subset of SUs within the plurality of SUs from the first system configuration of the DAP to the second system configuration of the DAP.

16. The method of claim 14 further comprising:
directing a subset of SUs within the plurality of SUs that store an EDS set of the EDS sets that correspond respectively to the plurality of data segments of the data object to service at least one of a first other read request or a first other write request from the first other computing device for at least one EDS of the EDS set of the EDS sets based on the DAP transition mapping during transition from the first system configuration of the DAP to the second system configuration of the DAP when performed on an EDS set-by-EDS set basis; and directing the subset of SUs within the plurality of SUs that store the EDS set of the EDS sets that correspond respectively to the plurality of data segments of the data object to service at least one of a second other read request or a second other write request from at least one of the first other computing device or the second other computing device for the at least one EDS of the EDS set of the EDS sets based on the second system configuration of the DAP after completion of the transition of the subset of SUs within the plurality of SUs from the first system configuration of the DAP to the second system configuration of the DAP.

17. The method of claim 14 further comprising:
directing a subset of SUs within the plurality of SUs of a vault that store at least some of an EDS set of the EDS sets that correspond respectively to the plurality of data segments of the data object to service at least one of a first other read request or a first other write request from the first other computing device for at least one EDS of the EDS set of the EDS sets based on the DAP transition mapping during transition of the subset of SUs within the plurality of SUs of the vault from the first system configuration of the DAP to the second system configuration of the DAP when performed on a vault-by-vault basis; and directing the subset of SUs within the plurality of SUs of the vault that store the at least some of the EDS set of the EDS sets that correspond respectively to the plurality of data segments of the data object to service at least one of a second other read request or a second other write request from at least one of the first other computing device or the second other computing device for the at least some of the EDS set of the EDS sets based on the second system configuration of the DAP after completion of the transition from the first system configuration of the DAP to the second system configuration of the DAP.

18. The method of claim 14 further comprising:
directing the plurality of SUs to service any other read request or any other write request from at least one of the first other computing device or the second other computing device for any EDS within the EDS sets based on the second system configuration of the DAP after completion of transition of the plurality of SUs from the first system configuration of the DAP to the second system configuration of the DAP.

19. The method of claim 14, wherein the computing device is a SU of the plurality of SUs within the DSN, a wireless smart phone, a laptop, a tablet, a personal computers (PC), a work station, or a video game device.

20. The method of claim 14, wherein the DSN includes at least one of a wireless communication system, a wire lined communication systems, a non-public intranet system, a public internet system, a local area network (LAN), or a wide area network (WAN).

* * * * *